(12) United States Patent
Hung et al.

(10) Patent No.: US 11,948,941 B2
(45) Date of Patent: Apr. 2, 2024

(54) SEMICONDUCTOR DEVICE, INTEGRATED CIRCUIT AND METHODS OF MANUFACTURING THE SAME

(71) Applicant: Taiwan Semiconductor Manufacturing Company, Ltd., Hsinchu (TW)

(72) Inventors: Yi-Tse Hung, Hsinchu (TW); Ang-Sheng Chou, Hsinchu (TW); Hung-Li Chiang, Taipei (TW); Tzu-Chiang Chen, Hsinchu (TW); Chao-Ching Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 16 days.

(21) Appl. No.: 17/355,206

(22) Filed: Jun. 23, 2021

(65) Prior Publication Data
US 2022/0285345 A1  Sep. 8, 2022

Related U.S. Application Data

(60) Provisional application No. 63/156,935, filed on Mar. 5, 2021.

(51) Int. Cl.
*H01L 29/417* (2006.01)
*H01L 21/8238* (2006.01)
(Continued)

(52) U.S. Cl.
CPC .... *H01L 27/092* (2013.01); *H01L 21/823807* (2013.01); *H01L 21/823814* (2013.01);
(Continued)

(58) Field of Classification Search
CPC ......... H01L 29/10; H01L 29/24; H01L 29/78; H01L 29/147; H01L 29/1033; H01L 29/14775; H01L 27/092; H01L 23/367; H01L 23/522; H01L 23/528; H01L 23/5226; H01L 23/5283; H01L 21/8238; H01L 21/823814; H01L 21/823871; H01L 21/823807
(Continued)

(56) References Cited

U.S. PATENT DOCUMENTS

2011/0114914 A1 * 5/2011 Numata ............ H01L 29/0673
977/811
2012/0168722 A1 * 7/2012 Chung ............ H01L 29/66045
977/734
(Continued)

*Primary Examiner* — Chuong A Luu
(74) *Attorney, Agent, or Firm* — JCIPRNET

(57) ABSTRACT

A semiconductor device includes a gate layer, a channel material layer, a first dielectric layer and source/drain terminals. The gate layer is disposed over a substrate. The channel material layer is disposed over the gate layer, where a material of the channel material layer includes a first low dimensional material. The first dielectric layer is between the gate layer and the channel material layer. The source/drain terminals are in contact with the channel material layer, where the channel material layer is at least partially disposed between the source/drain terminals and over the gate layer, and the gate layer is disposed between the substrate and the source/drain terminals.

20 Claims, 11 Drawing Sheets

(51) Int. Cl.
  *H01L 23/367*  (2006.01)
  *H01L 23/522*  (2006.01)
  *H01L 23/528*  (2006.01)
  *H01L 27/092*  (2006.01)
  *H01L 29/10*  (2006.01)
  *H01L 29/24*  (2006.01)

(52) U.S. Cl.
  CPC .... *H01L 21/823871* (2013.01); *H01L 23/367* (2013.01); *H01L 23/5226* (2013.01); *H01L 23/5283* (2013.01); *H01L 29/1033* (2013.01); *H01L 29/24* (2013.01); *H01L 29/41775* (2013.01)

(58) Field of Classification Search
  USPC .......................................................... 257/288
  See application file for complete search history.

(56) References Cited

U.S. PATENT DOCUMENTS

2019/0181367 A1\* 6/2019 Farmer .................. H01L 21/041
2020/0286959 A1\* 9/2020 Jin ....................... H01L 51/0048

\* cited by examiner

SEMICONDUCTOR DEVICE, INTEGRATED CIRCUIT AND METHODS OF MANUFACTURING THE SAME

CROSS-REFERENCE TO RELATED APPLICATION

This application claims the priority benefit of U.S. provisional application Ser. No. 63/156,935, filed on Mar. 5, 2021. The entirety of the above-mentioned patent application is hereby incorporated by reference herein and made a part of this specification.

BACKGROUND

Developments in shrinking sizes of semiconductor devices and electronic components make the integration of more devices and components into a given volume possible and lead to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
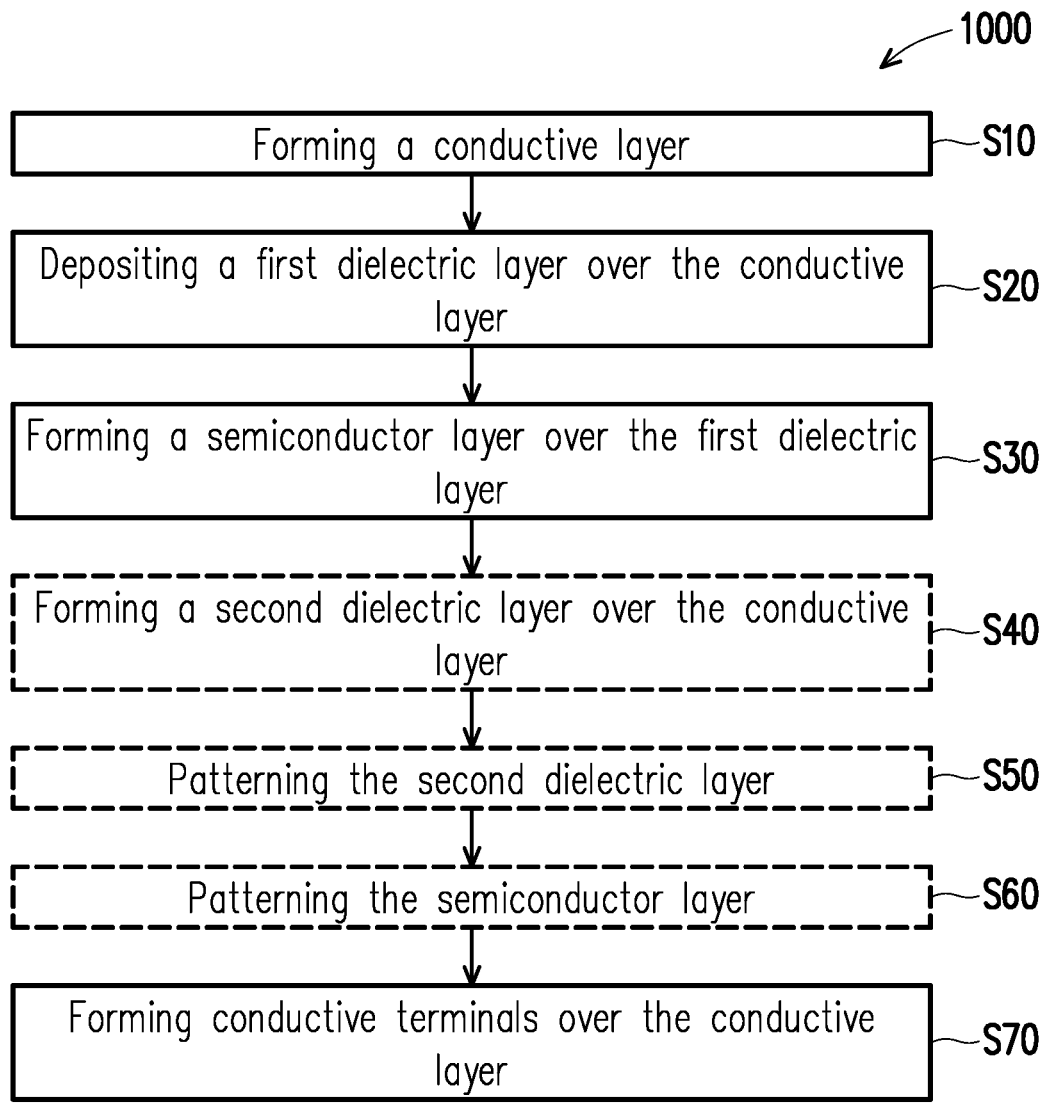
FIG. 1 is a flow chart illustrating a method of manufacturing a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the disclosure. For example, embodiments of the disclosure describe the exemplary manufacturing process of one or more semiconductor devices such as transistors and one or more integration structures such as integrated circuit structures having one or more such semiconductor devices. In the disclosure, the integrated circuit structure may be referred to as a (semiconductor) integrated circuit or a (semiconductor) integrated circuit structure. Certain embodiments of the disclosure are related to an integration structure including semiconductor transistors and other semiconductor devices. Substrates and/or wafers adopted in the exemplary manufacturing process may include one or more types of integrated circuitries or electronic components therein. The semiconductor device(s) may be formed over a bulk semiconductor substrate or a silicon/germanium-on-insulator substrate. In embodiments, the manufacturing method is part of a wafer level packaging process. The embodiments are intended to provide further explanations but are not used to limit the scope of the disclosure. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

A semiconductor device, an integrated circuit (IC) having the same and methods of manufacturing thereof are provided in accordance with various exemplary embodiments. Before addressing the illustrated embodiments specifically, certain advantageous features and aspects of the disclosed embodiments will be addressed generally. The semiconductor device may be adopted in a form of planar-like field effect transistor (planar-like FET) at a back-end-of-line (BEOL) structure of the IC for high device density. Described below is a semiconductor device of a back-gated planar-like FET with a low-dimensional material serving as a channel layer, where the low-dimensional material is capable of providing ideal geometry for an excellent electrostatic control in the operation of the FET while suppressing interface scattering at the interface with an adjacent layer and efficiently dissipating heat during the operation. With such low-dimensional material, the semiconductor device of back-gated planar-like FET can be formed in the BEOL structure of the IC to obtain efficiently heat dissipation and high device performance (with an extremely small foot print area of the IC, for example).

In addition, a heat dissipation layer or film may be further adopted in the semiconductor device of the back-gated planar-like FET with a low-dimensional material serving as the channel layer. The heat dissipation layer or film is capable of providing better heat dissipation to the semiconductor device, thereby suppressing possible degradation in the device performance for the IC due to lack of heat dissipation. The heat dissipation layer or film may be formed by a low-dimensional material. The low-dimensional material is a two-dimension (2D) material, in the disclosure. The intermediate stages of forming the semiconductor device and/or IC are illustrated in accordance with some embodiments. Some variations of some embodiments are discussed. Throughout the various views and illustrative embodiments, like reference numbers are used to designate like elements.

Figure 19:
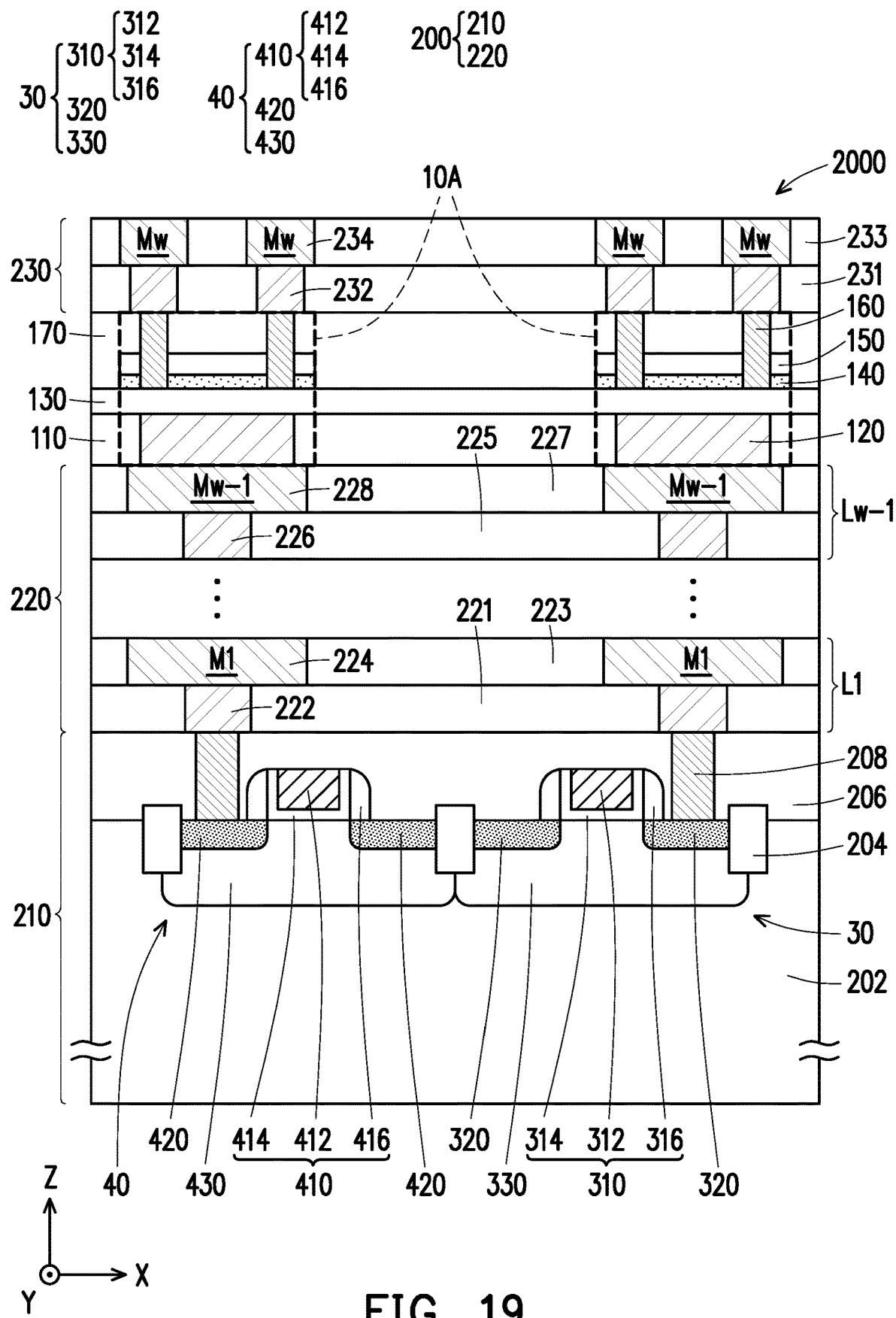
FIG. 19 is a cross-sectional view showing a portion of an integrated circuit with a semiconductor device therein in accordance with some embodiments of the disclosure.

FIG. 1 is a flow chart illustrating a method of manufacturing a semiconductor device in accordance with some embodiments of the disclosure. FIG. 2 through FIG. 7 are schematic cross-sectional views showing a method of manufacturing a semiconductor device 10A in accordance with some embodiments of the disclosure, within a device region DR of an integration structure (e.g. an IC 2000 of FIG. 19). FIG. 8 is a schematic plane view of the semiconductor device 10A depicted in FIG. 7, where FIG. 2 through FIG. 7 are the cross-sectional views taken along a line A-A' depicted in FIG. 8. FIG. 19 is a cross-sectional view showing a portion of an integrated circuit (IC) 2000 with a semiconductor device 10A therein in accordance with some embodiments of the disclosure.

Figure 2:
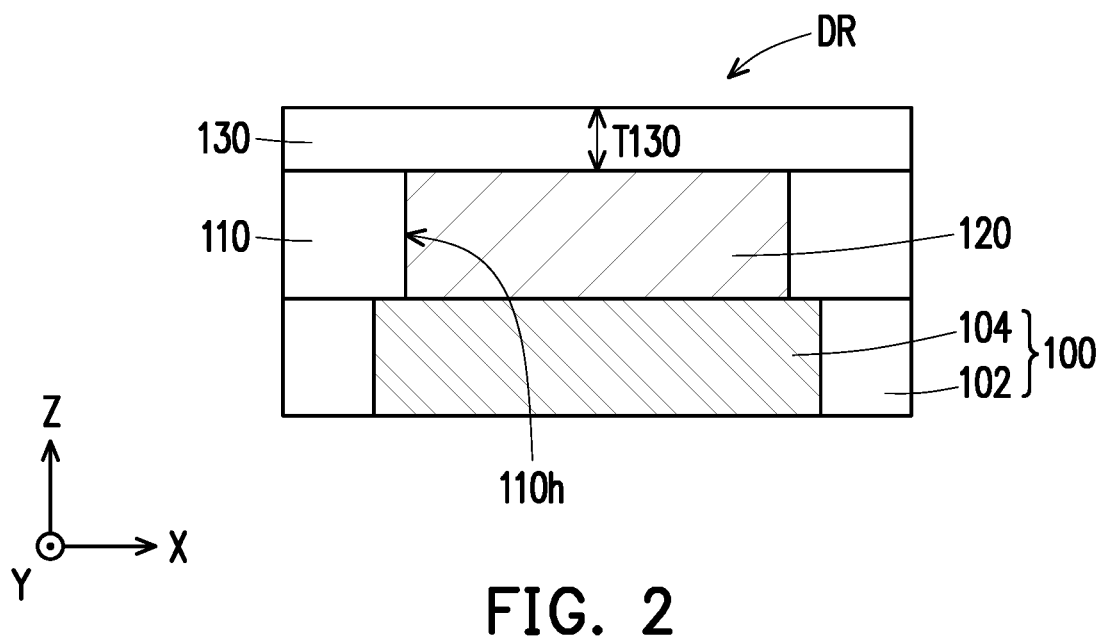
FIG. 2 through FIG. 7 are schematic cross-sectional views showing a method of manufacturing a semiconductor device in accordance with some embodiments of the disclosure.

Referring to FIG. 2, in some embodiments, an underlying structure 100 is provided. In some embodiments, the underlying structure 100 includes one or more than one isolation structure 102 and one or more than one connection structure 104 formed therein that being located over a semiconductor substrate (not shown) for providing routing function to one or more active components and/or one or more passive components formed in and/or on the semiconductor substrate. In FIGS. 2-7, only a portion of the device region DR of the underlying structure 100 is shown for illustration purposes. In one embodiment, the one or more active components include transistors, diodes, optoelectronic devices. In one embodiment, the one or more passive components include capacitors, inductors and resistors.

In some embodiments, the underlying structure 100 of FIG. 2 is substantially similar to an underlying structure 200 of the IC 2000 depicted in FIG. 19, where the underlying structure 200 includes a semiconductor substrate (e.g. 210) having one or more (semiconductor) device (e.g. 30 and/or 40) formed therein and an interconnect structure (e.g. 220) stacked thereon. The underlying structure 100 is at least a part (e.g. a topmost build-up layer) of the interconnection structure, where the interconnection structure provides electrical connection and interconnection to the (semiconductor) devices, in certain embodiments. In an aspect, the underlying structure 100 serves as an etching stop layer/structure to prevent any undesired damages or etches to layers underneath thereto (e.g. the rest of the underlying structure), for example. The details of the IC 2000 will be discussed later in greater detail in conjunction with FIG. 19 in addition to FIG. 2 through FIG. 7.

Referring back to FIG. 2, for example, the connection structure 104 (only one is shown) is formed in the isolation structure 102 (only one is shown) within the device region DR. It is understood that the number of the isolation structure 102 and/or the number of the connection structure 104 may be more than one, and the number or the configuration of the isolation structure 102 and/or the number or the configuration of the connection structure 104 should not be limited by the exemplary embodiments or drawings of the disclosure. In one embodiment, a material of the isolation structure 102 include a dielectric material, such as silicon oxide, silicon nitride, silicon carbide, silicon oxynitride, silicon carbonitride, silicon carbide oxynitride, spin-on glass (SOG), phosphosilicate glass (PSG), borophosphosilicate glass (BPSG), fluorinated silica glass (FSG), carbon doped silicon oxide (e.g., SiCOH), polyimide, and/or a combination thereof. In alternative embodiments, the material of the dielectric layer 102 include low-K dielectric materials. Examples of low-K dielectric materials may include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In certain embodiments, the material of the isolation structure 102 include a semiconductor material, such as silicon (Si) or germanium (Ge). In alternative embodiments, the material of the isolation structure 102 include a metal oxide material, such as sapphire ($Al_2O_3$), indium tin oxide (ITO), or the like. The isolation structure 102 may be formed by any suitable forming technique, such as deposition, spin-coating, sputtering, or other suitable methods.

In one embodiment, a material of the connection structure 104 include copper (Cu), copper alloys, aluminum (Al), aluminum alloy, nickel (Ni), manganese (Mn), magnesium (Mg), silver (Ag), gold (Au), tungsten (W), a combination of thereof, or the like. The connection structure 104 may be formed by deposition and patterning process. The deposition may include electroplating, electroless plating, chemical vapor deposition (CVD, such as plasma enhanced CVD (PE-CVD) and laser-assisted CVD), atomic layer deposition (ALD), and physical vapor deposition (PVD) (such as, sputtering, and e-beam evaporation), a combination thereof, or the like. The patterning process may include photolithography and etching processes. The etching process may include dry etching, wet etching, or a combination thereof. The underlying structure 100 may be referred to as a base layer or a substrate for the semiconductor device 10A.

Continued on FIG. 2, in some embodiments, a conductive layer 120 is formed on the underlying structure 100, in accordance with step S10 of a method 1000 as shown in FIG. 1. In some embodiments, the conductive layer 120 is referred to as a gate electrode or a gate of the semiconductor device 10A. For example, as shown in FIG. 2, the conductive layer 120 is embedded in an isolation layer 110 located over the underlying structure 100, and the conductive layer 120 is electrically connected to the connection structure 104. In one embodiment, the conductive layer 120 is in physical (or direct) contact with the connection structure 104. In some embodiments, the direction Z is a stacking direction of the conductive layer 120 and the underlying structure 100. The direction Z may be referred to as a vertical direction in the disclosure.

In some embodiments, a material of the isolation layer 110 includes a dielectric material, such as silicon oxide, silicon nitride, silicon carbide, silicon oxynitride, silicon carbonitride, silicon carbide oxynitride, SOG, PSG, BPSG, FSG, carbon doped silicon oxide (e.g., SiCOH), polyimide, a high-k dielectric material, an insulating-like low-dimension material, and/or a combination thereof. It should be noted that the high-k dielectric materials are generally dielectric materials having a dielectric constant greater than 4 or even greater than about 10. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the insulating-like low dimension material includes an 2D material having an insulating band-gap property (referred to as "insulating-like 2D material"), such as hexagonal boron nitride (h-BN). In one embodiment, the material of the isolation layer 110 is the same as the material of the isolation structure 102. In an alternative embodiment, the material of the isolation layer 110 is different from the material of the isolation structure 102.

The isolation layer 110 may be formed by CVD (e.g., flowable chemical vapor deposition (FCVD), PE-CVD, high density plasma CVD (HDP-CVD) or sub-atmospheric CVD (SACVD)), molecular layer deposition (MLD), spin-on coating, sputtering, exfoliation (such as mechanical exfoliation and liquid-phase exfoliation) and transfer, gas phase epitaxy, or other suitable methods. In one embodiment, the isolation layer 110 may be one-layer structure. In another embodiment, the isolation layer 110 may be multi-layer structure. The disclosure is not limited thereto. In some embodiments, the isolation layer 110 serves as an insulating layer, which is referred to as an inter-metal dielectric (IMD) layer.

In some embodiments, the conductive layer 120 is formed in the isolation layer 110. For example, as shown in FIG. 1, a surface of the conductive layer 120 is exposed from an illustrated top surface of the isolation layer 110. In certain embodiments, the conductive layer 120 is formed by a single damascene process. For example, an opening 110h is formed in and penetrates through the isolation layer 110, and the opening 110h is filled with a conductive material. In a subsequent step, a patterning process (e.g., a grinding process, a chemical-mechanical planarization (CMP) process, an etching process, or combinations thereof) is performed to remove excessive conductive material, thereby forming the conductive layer 120. In certain embodiments, a top surface of the conductive layer 120 is substantially coplanar with the top surface of the isolation layer 110 after the planarization process.

The conductive layer 120 may be includes one or more conductive materials. In other words, the conductive layer 120 may be a single-layer structure (of one material) or a multilayer structure (of one material or of two or more different materials). In some embodiments, the formation of the conductive material(s) includes one or more deposition processes selected from CVD (such as PE-CVD and laser-assisted CVD), ALD, PVD (such as, sputtering, and e-beam evaporation), or the like. In some embodiments, the formation of the conductive material(s) includes a plating process such as electroplating or electroless plating. The patterning process may include photolithography and etching processes. The etching process may include dry etching, wet etching, or a combination thereof. For example, the patterning process may be an anisotropic etching.

In some embodiments, the materials of the conductive layer 120 include cupper (Cu), aluminum (Al), titanium (Ti), tungsten (W), tantalum (Ta), nitride thereof, some other low resistance material, combinations thereof, and/or alloys thereof. For example, the conductive layer 120 may include one or more stacked layers of Cu, TiN, TaN, W/TiN, TiN/TiAl/TiN or TiN/TiAl/TaN. The conductive layer 120 may have a rectangular, square, polygonal, or round profile in a top view (e.g. a X-Y plane). The direction X is different from the direction Y, and the directions X and Y are different from the direction Z, in some embodiments. For example, the direction X is perpendicular to the direction Y, and the directions X and Y are perpendicular to the direction Z. In one embodiment, the material of the conductive layer 120 is the same as the material of the connection structure 104. In an alternative embodiment, the material of the conductive layer 120 is different from the material of the connection structure 104.

In addition, a barrier layer (not shown) may be optionally formed between the isolation layer 110 and the conductive layer 120. For example, the barrier layer is located at a sidewall of the conductive layer 120 to physically separate the isolation layer 110 and the conductive layer 120. In some embodiments, the barrier layer includes a material to prevent the conductive layer 120 from diffusing to the layers adjacent thereto. The material of the barrier layer may include Ti, Ta, TiN, TaN, or other suitable material, and may be formed using CVD, ALD, PVD, a combination thereof, or the like. Indeed, the barrier layer has the material different from that of the conductive layer 120. For example, the barrier layer includes TaN while the conductive layer 120 includes TiN. In some embodiments, the barrier layer is also optionally formed between the isolation structure 102 and the connection structure 104 for preventing the connection structure 104 from diffusing to the isolation structure 102.

In some embodiments, the connection structure 104 and the conductive layer 120 are formed in one step (e.g. via a dual damascene process), where the materials of the connection structure 104 and the conductive layer 120 are the same. In alternative embodiments, the connection structure 104 and the conductive layer 120 are formed in different steps, where the materials of the connection structure 104 and the conductive layer 120 are different.

Continued on FIG. 2, in some embodiments, after the formation of the conductive layer 120, a dielectric layer 130 is formed over the conductive layer 120, in accordance with step S20 of the method 1000 as shown in FIG. 1. In some embodiments, the dielectric layer 130 overlying the conductive layer 120 is referred to as a gate dielectric layer of the semiconductor device 10A. For example, the dielectric layer 130 is globally formed over the underlying structure 100 to cover the isolation layer 110 and the conductive layer 120. In certain embodiments, the dielectric layer 130 is in physical (or direct) contact with the isolation layer 110 and the conductive layer 120. In some embodiments, a thickness T130 of the dielectric layer 130 is approximately ranging from 0.5 nm to 15 nm.

The dielectric layer 130 may include a single-layer structure or a multilayer structure. A material of the dielectric layer 130 may include a dielectric material, such as silicon oxide, silicon nitride, silicon carbide, silicon oxynitride, silicon carbonitride, silicon carbide oxynitride, a high-k dielectric material, an insulating-like 2D material (such as h-BN), or a combination thereof. It should be noted that the high-k dielectric materials are generally dielectric materials having a dielectric constant greater than 4 or even greater than about 10. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In certain embodiments, the material of the dielectric layer 130 incudes a material having a thermal conductivity greater than 200 W/(m*k) and a dielectric constant greater than 4, such as aluminum nitride (AlN) or the like. In the embodiment of which the material of the dielectric layer 130 is a thermally conductive material, the dielectric layer 130 is thermally coupled to the conductive layer 120, and is further considered as a heat dissipator or heat dissipating layer to the semiconductor device 10A. In one embodiment, the material of the dielectric layer 130 is the same as the material of the isolation layer 110. In an alternative embodiment, the material of the dielectric layer 130 is different from the material of the isolation layer 110.

For one example, the material of the dielectric layer 130 is a single layer made of SiOx (where x is greater than 0), SiyNz (where y and z are independently greater than 0), HfO$_2$, Al$_2$O$_3$ or the like, which is formed by CVD (e.g., FCVD, PE-CVD, HDP-CVD or SACVD), ALD, sputtering, or other suitable methods. For another example, the material of the dielectric layer 130 is a single layer or a multilayer structure made of h-BN, which is formed by exfoliation (such as mechanical exfoliation and liquid-phase exfoliation) and transfer, gas phase epitaxy, CVD, or other suitable methods. For further another example, the material of the dielectric layer 130 is formed by depositing a composite layer of HfO$_2$/Al$_2$O$_3$ through ALD.

Figure 3:
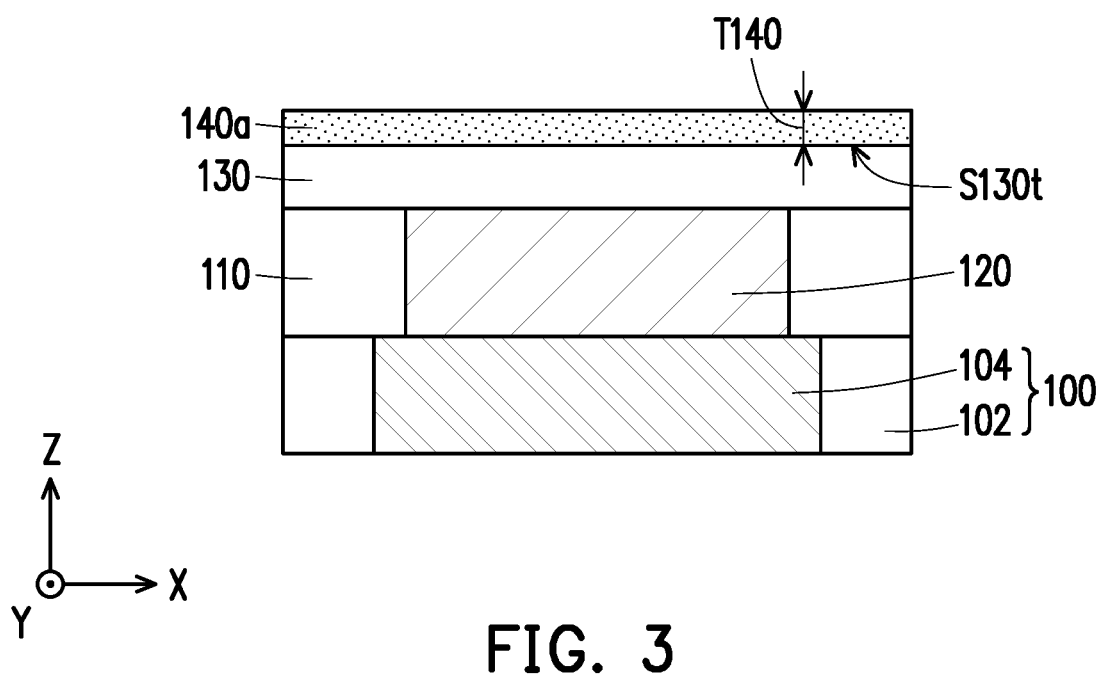

Referring to FIG. 3, in some embodiments, a semiconductor layer 140a is formed over the dielectric layer 130, in accordance with step S30 of the method 1000 as shown in FIG. 1. For example, the semiconductor layer 140a is electrically coupled to the conductive layer 120. For example, the semiconductor layer 140a is formed on a top surface S130t of the dielectric layer 130. In certain embodiments, the semiconductor layer 140a is in physical (or direct) contact with the dielectric layer 130. As shown in FIG. 3, for example, the semiconductor layer 140a is overlapped with the conductive layer 120 in the direction Z.

In some embodiments, a material of the semiconductor layer 140a includes carbon nanotube, carbon nanoribbon, a semiconducting-like low-dimension material, and/or a combination thereof. In some embodiments, the semiconducting-like low dimension material includes an 2D material having a semiconducting band-gap property (referred to as "semiconducting-like 2D material"), such as transition metal dichalcogenides or the like. In some embodiments, the transition metal dichalcogenides are represented by a general formula, NX$_2$, where N is a transition metal selected from the groups IVB, VB, or VIB of the periodic table, and X is one element selected from a group consisting of sulfur (S), selenium (Se), and tellurium (Te). For example, the semiconductor layer 140a may be a 2D semiconductor layer of WS$_2$, WSe$_2$ or MoS$_2$, however the disclosure is not limited thereto. The material of the semiconductor layer 140a has a band-gap size around 1 eV, in some embodiment. In some embodiments, the semiconductor layer 140a may be formed by exfoliation (such as mechanical exfoliation and liquid-phase exfoliation) and transfer, CVD, gas phase epitaxy, or other suitable forming technique.

In some embodiments, the semiconductor layer 140a includes a single-layer structure or a multilayer structure. For example, each layer is a monolayer of nanocrystals. In some embodiments, the formation of the semiconductor layer 140a includes, but not limited to, performing a mechanical exfoliation to obtain a single- or few-layer nanocrystals from the native multi-layer structure of a 2D semiconductor material, and then transferring the single- or few-layer nanocrystals onto the dielectric layer 130 via a temporary carrier (not shown). During the transfer, the single- or few-layer nanocrystals are placed onto the dielectric layer 130 by delaminating from the temporary carrier by an electrochemical delamination, and is laminated to the dielectric layer 130 by a hot roll lamination, for example. If more layers are needed to form the semiconductor layer 140a, the above steps can be repeated more than one time, in certain embodiments.

In some embodiments, a thickness T140 of the semiconductor layer 140a is approximately ranging from 0.3 nm to 4 nm. For example, the semiconductor layer 140a includes a structure of about 1 to about 4 monolayers of the nanocrystals of 2D semiconductor material, such as a multilayer structure including 3-4 monolayers. In certain embodiments, the thickness T140 of the semiconductor layer 140a is approximately ranging from 0.3 nm to 3 nm. For example, the semiconductor layer 140a includes a structure of about 1 to about 3 monolayers of the nanocrystals of 2D semiconductor material, such as a multilayer structure including 2-3 monolayers. In alternative embodiments, the thickness T140 of the semiconductor layer 140a is approximately ranging from 0.3 nm to 2 nm. For example, the semiconductor layer 140a includes a structure of about 1 to about 2 monolayers of the nanocrystals of 2D semiconductor material. However, the disclosure is not limited thereto; alternatively, the semiconductor layer 140a may include any number of monolayers based on the demand and design requirement, such as 1, 2, 3, 4, 5, 6, 7, 8, 9, 10, 15, 20, 25, 30, 35, 40, 45, 50 or more. In one embodiment, each monolayer of the nanocrystals in respect with the 2D semiconductor material has a thickness ranging approximately from 0.3 nm to 1 nm, in the direction Z.

Figure 4:
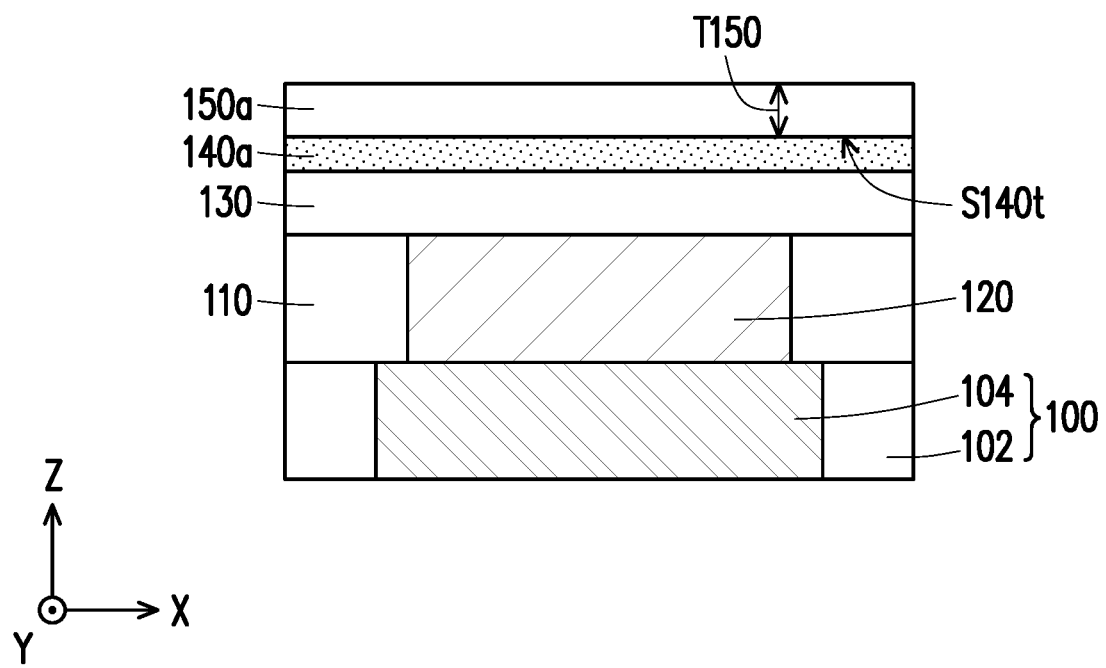

Referring to FIG. 4, in some embodiments, a dielectric layer 150a is formed over the semiconductor layer 140a, in accordance with step S40 of the method 1000 as shown in FIG. 1. In some embodiments, the dielectric layer 150a is made of a dielectric material having a thermal conductivity greater than 5 W/(m*k). The material of the dielectric layer 150a may include Al$_2$O$_3$, silicon nitride, MgO, AlN, an insulating-like 2D material (such as h-BN), or the like. For example, the dielectric layer 150a is globally formed on a top surface S140t of the semiconductor layer 140a. In certain embodiments, the dielectric layer 150a is in physical (or direct) contact with the semiconductor layer 140a. For example, the dielectric layer 150a is thermally coupled to the semiconductor layer 140a.

In some embodiments, a thickness T150 of the dielectric layer 150a is approximately ranging from 0.3 nm to 9 nm. For example, the dielectric layer 150a includes a multilayer structure of about 1 to about 30 monolayers of h-BN nanocrystals, e.g. a multilayer structure including 30 monolayers. In certain embodiments, the thickness T150 of the dielectric layer 150a is approximately ranging from 0.3 nm to 6 nm. For example, the dielectric layer 150a includes a multilayer structure of about 1 to about 20 monolayers of h-BN nanocrystals, e.g. a multilayer structure including 20 monolayers. In alternative embodiments, the thickness T150 of the dielectric layer 150a is approximately ranging from 0.3 nm to 3 nm. For example, the dielectric layer 150a includes a multilayer structure of about 1 to about 10 monolayers of h-BN nanocrystals, e.g. a multilayer structure including 10 monolayers. However, the disclosure is not limited thereto; alternatively, the dielectric layer 150a may include any number of monolayers based on the demand and design requirement, such as 1, 2, 10, 15, 20, 25, 30, 35, 40, 45, 50 or more. In one embodiment, each monolayer of the nanocrystals in respect with h-BN has a thickness of about 0.3 nm, in the direction Z.

Figure 5:
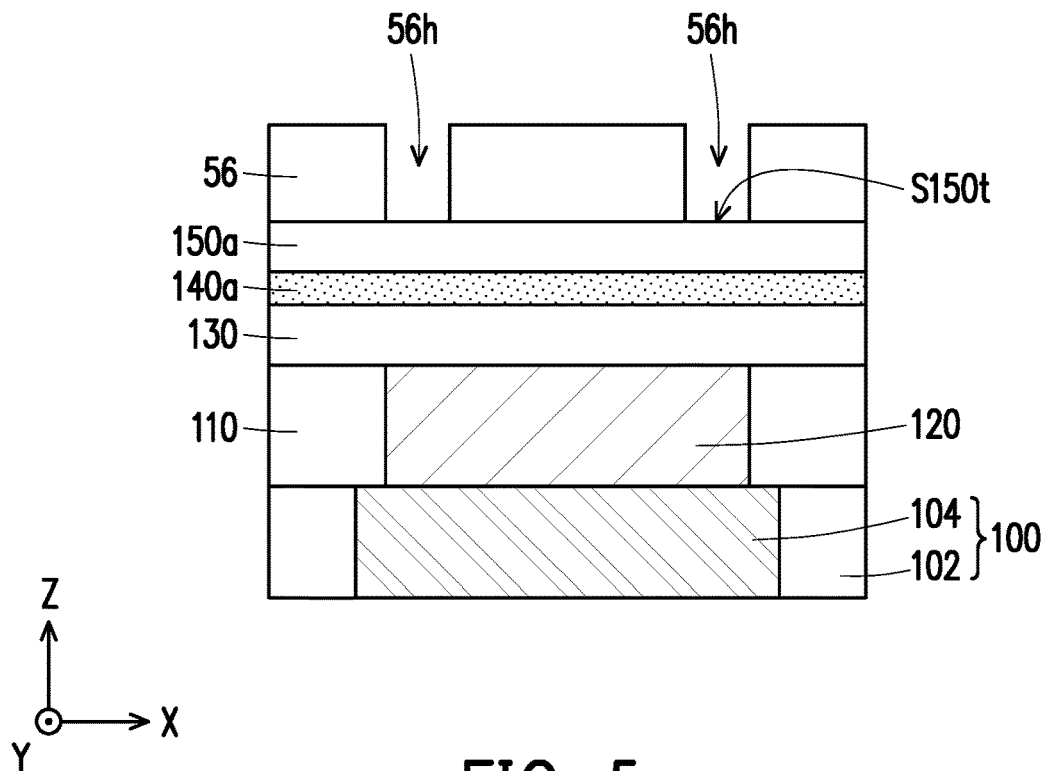

Referring to FIG. 5, in some embodiments, a resist layer 56 is formed on the dielectric layer 150a, where the resist layer 56 includes at least one opening 56h penetrating therethrough. For example, as shown in FIG. 5, a plurality of openings 56h are formed in and penetrate through the resist layer 56. In some embodiments, portions of a top surface S150t of the dielectric layer 150a are exposed by the openings 56h formed in the resist layer 56, respectively. In one embodiment, the resist layer 56 is formed by coating and photolithography processes or the like; however, the disclosure is not limited thereto. A material of the resist layer 56, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the resist layer 56 is referred to as a photoresist layer.

For illustrative purpose, only two openings 56h are shown in FIG. 5, however the disclosure is not limited thereto. The openings 56h may have a rectangular, square, polygonal, or round profile in a top view (e.g. the X-Y plane). The number and positioning location of the openings 56h corresponds to the number and positioning location of later-formed conductive structure(s) (such as a conductive pillar or conductive via, e.g. conductive terminals (e.g. 160 in FIG. 7) of the semiconductor device 10A). In some embodiments, the positioning locations of the openings OP are within the positioning location of the conductive layer 120 in a vertical projection on the underlying structure 100 along the direction Z.

Figure 6:
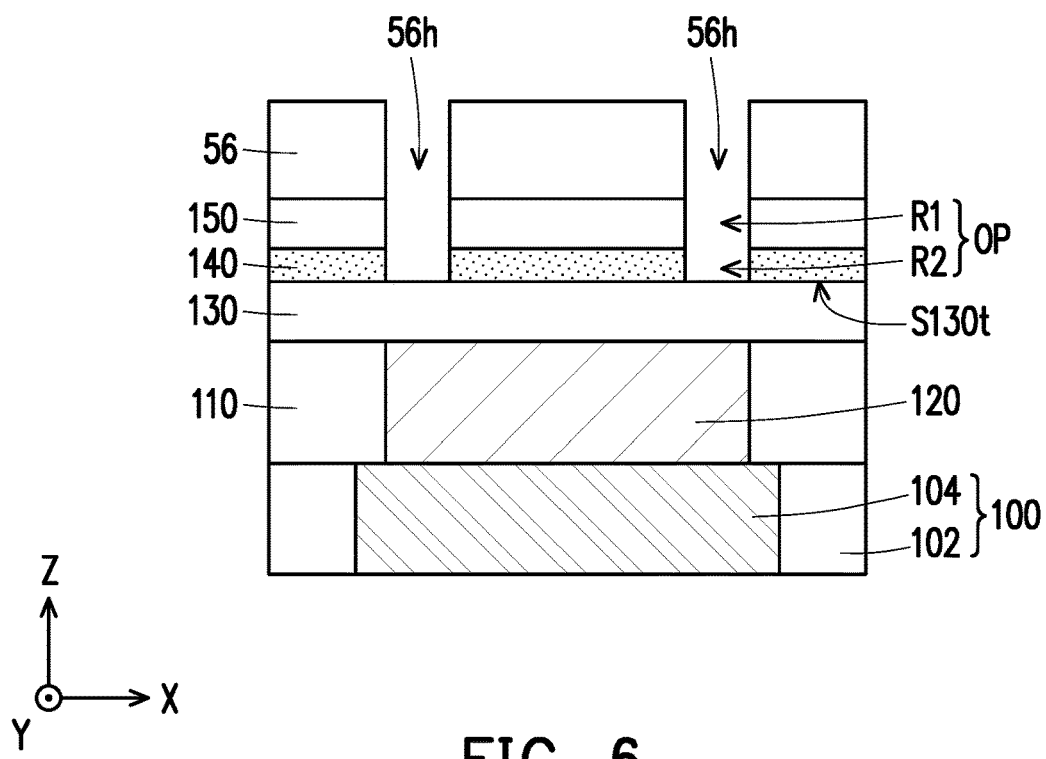

Referring to FIG. 5 and FIG. 6, in some embodiments, the dielectric layer 150a and the semiconductor layer 140a are patterned to form a dielectric layer 150 and a semiconductor layer 140, in accordance with step S50 and step 60 of the method 1000 as shown in FIG. 1. The formation of the dielectric layer 150 and the semiconductor layer 140 may include patterning the dielectric layer 150a to form the dielectric layer 150 by using the resist layer 56 as a mask, and then patterning the semiconductor layer 140a to form the semiconductor layer 140 by using the resist layer 56 and the dielectric layer 150 as a mask. For example, as shown in FIG. 5 and FIG. 6, the portions of the dielectric layer 150a exposed by the resist layer 56 are removed to form recesses R1 by etching, and portions of the semiconductor layer 140a exposed by the resist layer 56 and the dielectric layer 150 are removed to form recesses R2 by etching. The etching process may include a dry etch, a wet etch, or a combination thereof. The etching may be anisotropic.

As shown in FIG. 6, in some embodiments, the recesses R1 are formed in and penetrate through the dielectric layer 150, and the recesses R2 are formed in and penetrate through the semiconductor layer 140, where the recesses R1 and the recesses R2 are spatially communicated. For example, one recess R1 and a respective one recess R2 spatially communicated thereto are together referred to as one opening OP penetrating through the dielectric layer 150 and the semiconductor layer 140 and exposing the top surface S130t of the dielectric layer 130. In some embodiments, in a cross-sectional view, sidewalls (not labeled) of the openings OP includes substantially vertical sidewalls. However, the disclosure is not limited thereto; alternative, the sidewalls of the openings OP may include slant sidewalls.

The dielectric layer 150 and the semiconductor layer 140 may be formed in one etching process. In embodiments of which dielectric layer 150 and the semiconductor layer 140 are formed in the same etching process, the etching process is selective to the material of the dielectric layer 150a and the material of the semiconductor layer 140a (e.g., selectively etches the material of the dielectric layer 150a and the material of the semiconductor layer 140a at a faster rate than the material of the dielectric layer 130).

Alternatively, the dielectric layer 150 and the semiconductor layer 140 may be formed in different etching processes. In embodiments of which dielectric layer 150 and the semiconductor layer 140 are formed in different etching process (e.g. a first etching process and a second etching process), the first etching process is selective to the material of the dielectric layer 150a (e.g., selectively etches the material of the dielectric layer 150a at a faster rate than the material of the semiconductor layer 140a), and the second etching process is selective to the material of the semiconductor layer 140a (e.g., selectively etches the material of the semiconductor layer 140a at a faster rate than the material of the dielectric layer 130 and the material of the dielectric layer 150).

Figure 7:
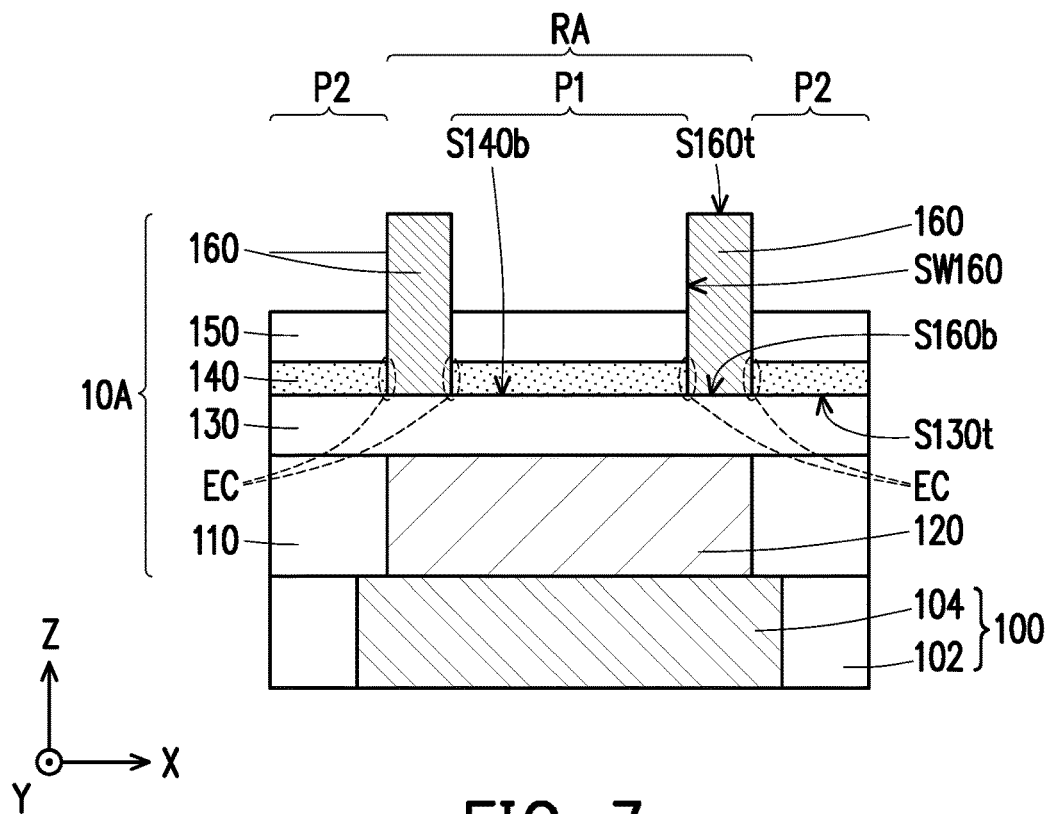
Figure 8:
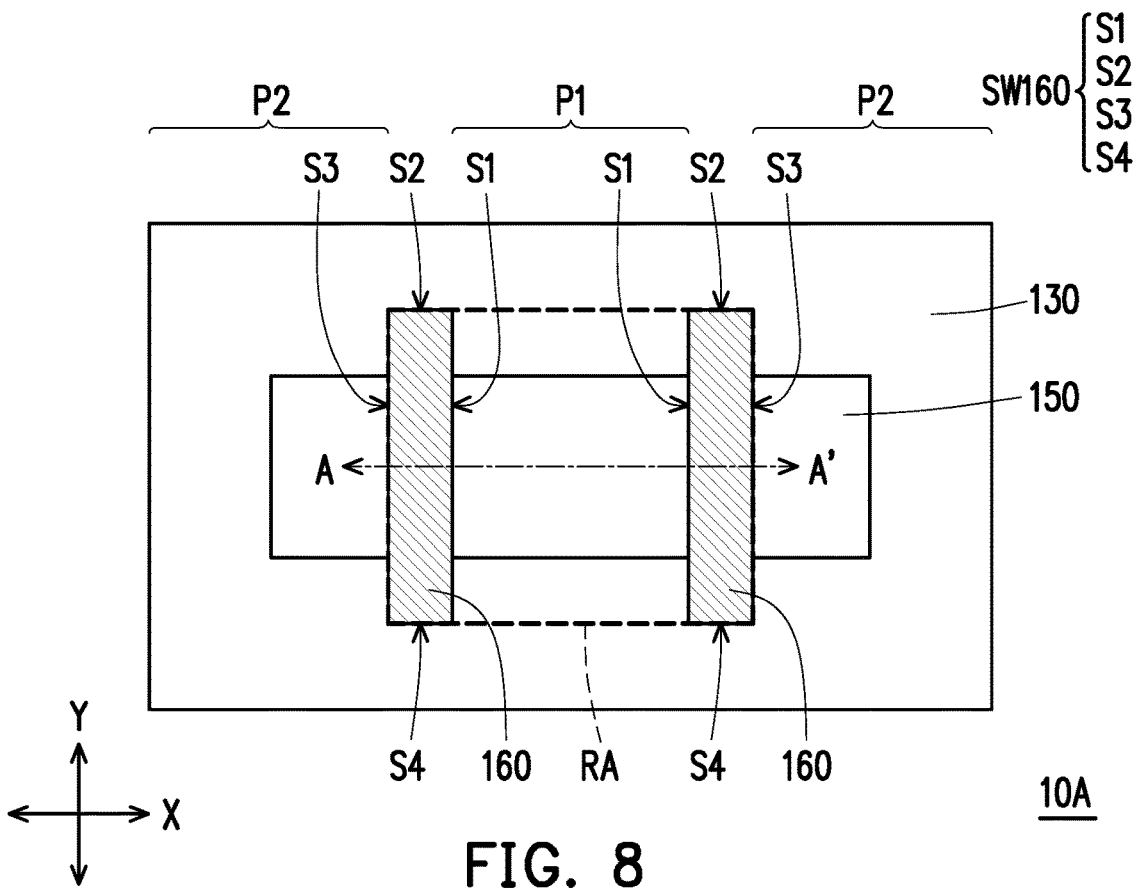
FIG. 8 is a schematic plane view of the semiconductor device depicted in FIG. 7.

Referring to FIG. 7, in some embodiments, conductive terminals 160 are formed over the conductive layer 120, in accordance with step S70 of the method 1000 as shown in FIG. 1. In some embodiments, the conductive terminals 160 are referred to as source/drain terminals of the semiconductor device 10A. For example, the conductive terminals 160 stand on the top surface S130t of the dielectric layer 130. In certain embodiments, the conductive terminals 160 are in physical (or direct) contact with the dielectric layer 130. As shown in FIG. 7, for example, bottom surfaces S160b of the conductive terminals 160 are in physical contact with the top surface S130t of the dielectric layer 130. In some embodiments, an edge contact EC is presented at an interface between the conductive terminals 160 and the semiconductor layer 140. That is, a proper contact between the conductive terminals 160 and the semiconductor layer 140 is established. As illustrated in FIG. 7, sidewalls SW160 of the conductive terminals 160 are at least partially in physical contact with the dielectric layer 150 and the semiconductor layer 140, for example.

In some embodiments, the conductive terminals 160 are overlapped with the conductive layer 120, in the direction Z. In some embodiments, a portion of the semiconductor layer 140 interposed between the conductive terminals 160 and overlapped with the conductive layer 120 is referred to as a channel layer or a channel of the semiconductor device 10A. Owing to the semiconductor layer 140 of semiconducting 2D material, an excellent electrostatic control in an operation of the semiconductor device 10A is obtained, thereby improving the device performance. Up to here, the semiconductor device 10A is manufactured. A conduction status of the channel of the semiconductor device 10A is controlled by a voltage applied onto the conductive layer 120. In other words, the conductive layer 120 serving as the gate of the semiconductor device 10A provides a channel control of the semiconductor device 10A (e.g., turn on or turn off the channel of the semiconductor device 10A). In some embodiments, the dielectric layer 150 being thermally coupled to the semiconductor layer 140 is referred to as a heat dissipator or heat dissipating layer of the semiconductor device 10A. Owing to the dielectric layer 150, better heat dissipation of the semiconductor device 10A is achieved, thereby suppressing the mobility degradation and thus further improving the device performance. In addition, if considering the material of the dielectric layer 150 is the insulating-like 2D material, the surface scattering between the dielectric layer 150 and its adjacent layers can be suppressed.

The formation of the conductive terminals 160 may include, but not limited to, forming a conductive material in the openings 56h formed in the resist layer 56 and the openings OP formed in the dielectric layer 150 and the semiconductor layer 140 to form the conductive terminals 160, and then removing the resist layer 56. In some embodiments, the conductive material is formed by plating, deposition, or any other suitable method. The plating process may include electroplating, electroless plating, or the like. The deposition process may include CVD, ALD, PVD, or the like. In some embodiments, the conductive material is a metallic material including a metal or a metal alloy. In certain embodiments, the conductive material includes a metal selected from the groups IIIB, IVB, VB, VIB, VIIIB, IB, or IIIA of the periodic table. For example, the material of the conductive terminals 160 includes Sc, Ti, Nb, Cr, W, Ni, Pd, Pt, Ag, Au, Al, or the like. In one embodiment, the resist layer 56 is removed by acceptable ashing process and/or photoresist stripping process, such as using an oxygen plasma or the like. The disclosure is not limited thereto.

In some embodiments, in the formation of the conductive terminals 160, prior to the forming the conductive material in the openings 56h and OP, a barrier material (not shown) and a seed material (not shown) are sequentially formed over the openings 56h and OP and conformally covering the top surfaces S130t of the dielectric layer 130 exposed by the openings 56h and OP and the sidewalls of the openings 56h and OP; then, the conductive material (not shown) is filled into the openings 56h and OP to form the conductive terminals 160. That is, the conductive terminals 160, individually, may include the conductive material, the seed material covering a bottom surface and sidewalls of the conductive material, and the barrier material covering an outer bottom surface and an outer sidewalls of the seed material, where the seed material is interposed between the conductive material and the barrier material, and the barrier material is located between the seed material and the resist layer 56. The barrier material and the seed material may individually include one or more materials selected tungsten (W), ruthenium (Ru), molybdenum (Mo), tantalum (Ta), titanium (Ti), alloys thereof, and nitrides thereof, for example. In some embodiments, the barrier material is formed by CVD or PVD. In some embodiments, the seed material is formed by CVD or PVD. In certain embodiments, the barrier material is optional, where the seed material is interposed between the conductive material and the resist layer 56.

In some embodiments, the extra barrier material, the extra seed material and the extra conductive material may be removed by performing a planarization process, an etching process, other suitable processes, or combinations thereof. In some embodiments, the planarization process may include performing a grinding process, a CMP process, or a combination thereof.

Referring to FIG. 7 and FIG. 8, in some embodiments, the semiconductor device 10A includes the conductive layer 120, the dielectric layer 130, the semiconductor layer 140, the dielectric layer 150 and the conductive terminals 160 sequentially stacked from the bottom to the top. For example, the conductive layer 120 functions as the gate, the conductive terminals 160 located on the conductive layer 120 functions as the source and the drain, the portion of the semiconductor layer 140 located between the conductive terminals 160 and overlapped with the conductive layer 120 functions as the channel, and the dielectric layer 130 sandwiched between the portion of semiconductor layer 140 and the conductive layer 120 functions as the gate dielectrics. In certain embodiments, the semiconductor device 10A further includes the isolation layer 110, where the conductive layer 120 are laterally wrapped by the isolation layer 110, and the isolation layer 110 functions as a protecting layer of the conductive layer 120. In some embodiments, the semiconductor device 10A is a bottom-gated transistor structure or a back-gate transistor structure. For example, the semiconductor device 10A is a bottom-gated planar-like FET or a back-gate planar-like FET.

Bottom surfaces S160b of the conductive terminals 160 are located inside the semiconductor device 10A, and top surfaces S160t of the conductive terminals 160 are located outside the semiconductor device 10A (e.g. being free from the dielectric layer 150 and the semiconductor layer 140), in some embodiments. As shown in FIG. 7, for example, the bottom surfaces S160b of the conductive terminals 160 and a bottom surface S140b of the semiconductor layer 140 are substantially coplanar to each other at the top surface S130t of the dielectric layer 130. In one embodiment, the conductive terminals 160 stand on the dielectric layer 130, extending and penetrating through the semiconductor layer 140 and the dielectric layer 150, and protrude away from the dielectric layer 150. For example, as shown in FIG. 7, a portion of the sidewalls SW160 of each of the conductive terminals 160 is connected to the dielectric layer 150, another portion of the sidewalls SW160 of each of the conductive terminals 160 is connected to the semiconductor layer 140, and the rest of the sidewalls SW160 of each of the conductive terminals 160 is free from the dielectric layer 150 and the semiconductor layer 140. Owing to the edge contact EC (e.g. an in-plane contact) between the semiconductor layer 140 and the sidewalls SW160 (e.g. at sides S1, where the sidewalls SW160 each includes sides S1, S2, S3 and S4) of the conductive terminals 160, the contact between the conductive terminals 160 and the semiconductor layer 140 is enhanced so to improve the current injection efficiency, thereby improving the device performance. In addition, due to the edge contact EC, the heat generated from the conductive layer 120 is transmitted to the conductive terminals 160 without passing through the semiconductor layer 140, and thus the heat dissipation is also improved.

Continued on FIG. 7 and FIG. 8, for example, the dielectric layer 150 extends along the direction X while the conductive terminals 160 extend along the direction Y. In one embodiment, a size of the conductive terminals 160 is greater than a size of the dielectric layer 150 in the top view along the extending direction (e.g. the direction Y) of the conductive terminals 160, as shown in FIG. 8. However, the disclosure is not limited thereto; alternatively, the size of the conductive terminals 160 may be less than or substantially equal to the size of the dielectric layer 150 in the top view along the extending direction (e.g. the direction Y) of the conductive terminals 160. In one embodiment, in the top view along the direction X, a positioning location of the dielectric layer 150 extends beyond a region RA confined by positioning locations of the conductive terminals 160, as shown in FIG. 8. Alternatively, in the top view along the direction X, the positioning location of the dielectric layer 150 may be substantially aligned with or within the region RA confined by the positioning locations of the conductive terminals 160. In one embodiment, in the top view along the direction X, a positioning location of the semiconductor layer 140 extends beyond the region RA confined by positioning locations of the conductive terminals 160. Alternatively, in the top view along the direction X, the positioning location of the semiconductor layer 140 may be substantially aligned with or within the region RA confined by the positioning locations of the conductive terminals 160.

In some embodiments, in the top view, the shape of the semiconductor layer 140 and the shape of the dielectric layer 150 in the semiconductor device 10A share the same contour. That is, in the top view, the positioning location of the semiconductor layer 140 and the positioning location of the dielectric layer 150 are completely overlapped, for example. Alternatively, in the top view, the positioning location of the dielectric layer 150 may be in within the positioning location of the semiconductor layer 140. Or, the positioning location of the semiconductor layer 140 may extend beyond the positioning location of the dielectric layer 150. The disclosure is not limited thereto, as long as the contact between the semiconductor layer 140 (being overlapped with the conductive layer 120 in the stacking direction thereof) and the conductive terminals 160 is properly established. In the cross-section, sidewalls of the semiconductor layer 140 are aligned with sidewalls of the dielectric layer 150, as depicted in FIG. 19, for example. In one embodiment, the sidewalls of the semiconductor layer 140 and the sidewalls of the dielectric layer 150 are substantially vertical sidewalls. In alternative embodiments, the sidewalls of the semiconductor layer 140 and the sidewalls of the dielectric layer 150 may be formed with slant sidewalls if feasible.

In some embodiments, as shown in FIG. 7 and FIG. 8, the semiconductor device 10A is formed over the underlying structure 100 for further interconnecting to other (semiconductor) devices underlying thereto. In some embodiments, an additional interconnection structure may be stacked on and electrically connected to the semiconductor device 10A through the conductive terminals 160. In certain embodiments, the semiconductor device 10A is sandwiched between and electrically coupled to two interconnection structures formed during the BEOL processes. Referring to FIG. 19, for example, the integrated circuit (IC) 2000 includes a semiconductor substrate 210, an interconnect structure 220 stacked on the semiconductor substrate 210, at least one semiconductor devices 10A (depicted in FIG. 7) formed over the interconnect structure 220, and an interconnect structure 230 stacked thereon. For example, a plurality of semiconductor devices 10A are included in the IC 2000 of FIG. 19; however, the disclosure is not limited thereto. The number of the semiconductor devices 10A may be one or more than one based on the demand and design requirement. In some embodiments, the interconnect structure 220, the semiconductor devices 10A and the interconnect structure 230 are sequentially formed over the semiconductor substrate 210 (from bottom to top) during the BEOL processes. The IC 2000 may be referred to as an integration structure. The semiconductor substrate 210 and the interconnect structure 220 may be together referred to as the underlying structure 200. In some embodiments, the underlying structure 100 of FIG. 2 is substantially similar to the underlying structure 200 of the IC 2000 depicted in FIG. 19.

Referring to FIG. 2 and FIG. 19, in some embodiments, the underlying structure 100 or the underlying structure 200 includes a semiconductor substrate. In one embodiment, the underlying structure 100 or 200 comprises a crystalline silicon substrate or a doped semiconductor substrate (e.g., p-type semiconductor substrate or n-type semiconductor substrate). In certain embodiments, the underlying structure 100 or 200 comprises one or more doped regions or various types of doped regions, depending on design requirements. In some embodiments, the doped regions are doped with p-type and/or n-type dopants. For example, the p-type dopants are boron or $BF_2$ and the n-type dopants are phosphorus or arsenic. The doped regions may be configured for an n-type metal-oxide-semiconductor (NMOS) transistor or a p-type MOS (PMOS) transistor. In some alternative embodiments, the underlying structure 100 or 200 includes a semiconductor substrate made of other suitable elemental semiconductor, such as diamond or germanium; a suitable compound semiconductor, such as gallium arsenide, silicon carbide, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, as shown in FIG. 19, the underlying structure 200 includes the semiconductor substrate 210, where the semiconductor substrate 210 includes a wide variety of devices (also referred to as semiconductor devices) formed in a substrate 202. The device may include active components, passive components, or a combination thereof. The devices may include integrated circuits devices. The devices may include transistors, capacitors, resistors, diodes, photodiodes, fuse devices, or other similar devices. The functions of the devices may include memory, processors, sensors, amplifiers, power distribution, input/output circuitry, or the like.

For example, as shown in FIG. 19, the devices such as a PMOS transistor 30 and a NMOS transistor 40 are formed in the substrate 202. As shown in FIG. 19, in some embodiments, more than one isolation structures 204 are formed in the substrate 202 for separating the PMOS transistor 30 and the NMOS transistor 40. In certain embodiments, the isolation structures 204 are trench isolation structures. In other embodiments, the isolation structures 204 includes local oxidation of silicon (LOCOS) structures. In some embodiments, the insulator material of the isolation structures 204 includes silicon oxide, silicon nitride, silicon oxynitride, a spin-on dielectric material, or a low-k dielectric material. In one embodiment, the insulator material may be formed by chemical vapor deposition (CVD) such as HDP-CVD and SACVD or formed by spin-on. In certain embodiments, the devices (such as the PMOS transistor 30 and the NMOS transistor 40) and the isolation structures 204 are formed in the underlying structure 200 during the front-end-of-line (FEOL) processes. In one embodiment, the PMOS transistor 30 and the NMOS transistor 40 are formed following the complementary MOS (CMOS) processes. The number and configurations of the devices formed in the substrate 202 should not be limited by the embodiments or drawings of this disclosure. It is understood that the number and configurations of the devices may have different material or configurations depending on product designs.

In some embodiments, the PMOS transistor 30 includes a gate structure 310 and source/drain regions 320 located at two opposite sides of the gate structure 310, where the gate structure 310 is formed on an n-well region 330, and the source/drain 320 are formed in the n-well region 330. In one embodiment, the gate structure 310 includes a gate electrode 312, a gate dielectric layer 314 and a gate spacer 316. The gate dielectric layer 314 may spread between the gate electrode 312 and the substrate 202, and may or may not further cover a sidewall of the gate electrode 312. The gate spacer 316 may laterally surround the gate electrode 312 and the gate dielectric layer 314. In one embodiment, the source/drain regions 320 include doped regions of p-type dopant that are formed in the n-well region 330 by ion implantation. In an alternative embodiment, the source/drain regions 320 include epitaxial structures formed in and protruding from a surface of the substrate 202, that are formed by epitaxial growth.

In some embodiments, the NMOS transistor 40 includes a gate structure 410 and source/drain regions 420 located at two opposite sides of the gate structure 410, where the gate structure 410 is formed on an p-well region 430, and the source/drain 420 are formed in the p-well region 430. In one embodiment, the gate structure 410 includes a gate electrode 412, a gate dielectric layer 414 and a gate spacer 416. The gate dielectric layer 414 may spread between the gate electrode 412 and the substrate 202, and may or may not further cover a sidewall of the gate electrode 412. The gate spacer 416 may laterally surround the gate electrode 412 and the gate dielectric layer 414. In one embodiment, the source/drain regions 420 include doped regions of n-type dopant that are formed in the p-well region 430 by ion implantation. In an alternative embodiment, the source/drain regions 420 include epitaxial structures formed in and protruding from a surface of the substrate 202, that are formed by epitaxial growth.

As illustrated in FIG. 19, for example, the semiconductor substrate 210 further includes a dielectric layer 206 stacked on the substrate 202 and a plurality of contact plugs 208 penetrating through the dielectric layer 206 to electrically connect to the PMOS transistor 30 and the NMOS transistor 40. In certain embodiments, the dielectric layer 206 and the contact plugs 208 are also formed in the underlying structure 200 during the FEOL processes. The dielectric layer 206 may laterally surround the gate structures 310, 410 and cover the source/drain regions 320, 420 for providing protections to the devices formed in/on the substrate 202. Some of the contact plugs 208 may penetrate through the dielectric layer 206 in order to establish electrical connection with the source/drain regions 320, 420, while others of the contact plugs 216 (not shown) may penetrate through the dielectric layer 206 to establish electrical connection with the gate electrodes (e.g. the gate electrodes 312, 412) of the gate structures 310, 410, in order to provide terminals for electrical connections to later-formed components (e.g. the interconnect structure 220) or external components.

The dielectric layer 206 may be referred to as an interlayer dielectric (ILD) layer, while the contact plugs 208 may be referred to as metal contacts or metallic contacts. For example, the contact plugs 208 electrically connected to the source/drain regions 320, 420 are referred to as source/drain contacts, and the contact plugs 208 electrically connected to the gate electrodes 312, 412 are referred to as gate contacts. In some embodiments, the contact plugs 208 may include copper (Cu), copper alloys, nickel (Ni), aluminum (Al), manganese (Mn), magnesium (Mg), silver (Ag), gold (Au), tungsten (W), a combination of thereof, or the like. The contact plugs 208 may be formed by, for example, plating such as electroplating or electroless plating, CVD such as PE-CVD, ALD, PVD, a combination thereof, or the like.

In some embodiments, the dielectric layer 206 includes silicon oxide, silicon nitride, silicon carbide, silicon oxynitride, silicon carbonitride, silicon carbide oxynitride, SOG, PSG, BPSG, FSG, carbon doped silicon oxide (e.g., SiCOH), polyimide, and/or a combination thereof. In alternative embodiments, the dielectric layer 206 include low-K dielectric materials. Examples of low-K dielectric materials may include BLACK DIAMOND® (Applied Materials of Santa Clara, Calif.), Xerogel, Aerogel, amorphous fluorinated carbon, Parylene, BCB, Flare, SILK® (Dow Chemical, Midland, Mich.), hydrogen silsesquioxane (HSQ) or fluorinated silicon oxide (SiOF), and/or a combination thereof. It is understood that the dielectric layer 206 may include one or more dielectric materials. For example, the dielectric layer 206 include a single-layer structure or a multilayer structure. In some embodiments, the dielectric layer 206 is formed to a suitable thickness by CVD such as FCVD, HDP-CVD, SACVD, spin-on, sputtering, or other suitable methods.

In some embodiments, as shown in FIG. 19, the interconnect structure 220 is formed over and stacked on the semiconductor substrate 210, and is electrically connected to the devices such as the PMOS transistor 30 and the NMOS transistor 40 through the contact plugs 208 for providing routing function thereto. The interconnect structure 220 may be referred to as a first interconnect structure or a (first) redistribution circuit structure of the IC 2000. In some embodiments, the interconnect structure 220 includes one or more build-up layers (L1, . . . , Lw-1, where w is a positive integer of 2 or greater) formed with insulating layers and conductive layers, where the conductive layers include conductive trace(s) horizontally extended (e.g. extending in the directions X and/or Y) and/or conductive via(s) vertically extended (e.g. extending in the direction Z). The build-up layers may also be referred to as build-up tiers. The number or the configuration of build-up layers/tiers in the interconnect structure 220 should not be limited by the embodiments or drawings of this disclosure.

For example, the interconnect structure 220 at least includes insulating layers 221, 223, 225, 227, conductive vias 222, 226 and conductive traces 224, 228. In one embodiment, the conductive vias 222 are disposed on and electrically connected to the PMOS transistor 30 and the NMOS transistor 40 through the contact plugs 208 embedded in the dielectric layer 206. The conductive traces 224 are disposed on and electrically connected to the conductive vias 222. The insulating layers 221, 223 are collectively referred to as an IMD layer laterally wrapping the conductive vias 222 and the conductive traces 224 to constitute a build-up layer L1. In one embodiment, the conductive traces 228 are disposed on and electrically connected to the conductive vias 226. The insulating layers 225, 227 are collectively referred to as an IMD layer laterally wrapping the conductive vias 226 and the conductive traces 228 to constitute another build-up layer Lw-1. As shown in FIG. 19, the build-up layer L1 is electrically connected to the build-up layer Lw-1 through other build-up layer(s) (not shown), for example. Alternatively, the build-up layer L1 may be electrically connected to the build-up layer Lw-1, directly. Alternatively, the build-up layer L1 may be omitted, where the build-up layer Lw-1 may be directly electrically coupled to the contact plugs 208 without other conductive elements therebetween.

In some embodiments, after the formation of the interconnect structure 220, the semiconductor devices 10A and the interconnect structure 230 are sequentially stacked on the interconnect structure 220, along the direction Z (e.g., a build-up direction of the BEOL structure), as shown in FIG. 19. The semiconductor devices 10A are disposed between and electrically connected the interconnect structure 220 and the interconnect structure 230. The details of the semiconductor devices 10A have been described in FIG. 1 through FIG. 8, and thus are not repeated therein for brevity. In some embodiments, the semiconductor devices 10A are located on the interconnect structure 220, where the semiconductor devices 10A are electrically coupled to the conductive traces 228 of the interconnect structure 220 through the conductive layers 120. For example, the conductive layers 120 of the semiconductor devices 10A are in (physical) contact with the conductive traces 228 of the interconnect structure 220. In some embodiments, the semiconductor devices 10A are electrically coupled and electrically communicated to the devices such as the PMOS transistor 30 and the NMOS transistor 40 through the interconnect structure 220.

In one embodiment, each of the devices formed in the substrate 202 (e.g. the PMOS transistor 30 and the NMOS transistor 40) is electrically coupled and electrically communicated to one semiconductor device 10A (as shown in FIG. 19) or more than one semiconductor device 10A (not shown). However, the disclosure is not limited thereto; alternatively, only one or a part of the devices formed in the substrate 202 is electrically coupled and electrically communicated to one or more than one semiconductor device 10A, respectively.

In some embodiments, a dielectric layer 170 is formed on the semiconductor devices 10A for providing protection to the semiconductor devices 10A. In addition, owing to the dielectric layer 170, a high degree of coplanarity is achieved to facilitate the formation of a later-formed element (e.g., the interconnect structure 230). As shown in FIG. 19, for example, the top surfaces S160t of the conductive terminals are accessibly revealed by the dielectric layer 170. The dielectric layer 170 may be referred to as a protection layer or a passivation layer. The dielectric layer 170 may include a single-layer structure or a multilayer structure. A material of the dielectric layer 170 may include a dielectric material, such as silicon oxide, silicon nitride, silicon carbide, silicon oxynitride, silicon carbonitride, silicon carbide oxynitride, a high-k dielectric material, an insulating-like 2D material (such as h-BN), or a combination thereof. In one embodiment, the material of the dielectric layer 170 is the same as the material of the isolation layer 110. In an alternative embodiment, the material of the dielectric layer 170 is different from the material of the isolation layer 110. For example, the dielectric layer 170 is formed by CVD (e.g., FCVD, PE-CVD, HDP-CVD or SACVD), ALD, sputtering, exfoliation (such as mechanical exfoliation and liquid-phase exfoliation) and transfer, gas phase epitaxy, or other suitable methods.

In some embodiments, the interconnect structure 230 includes one or more build-up layers formed with insulating layers and conductive layers, where the conductive layers include conductive trace(s) horizontally extended (e.g. extending in the directions X and/or Y) and/or conductive via(s) vertically extended (e.g. extending in the direction Z). For simplicity, only one build-up layer is shown in the interconnect structure 230 of FIG. 19 for illustrative purpose, however the disclosure is not limited thereto. The number or the configuration of build-up layers/tiers in the interconnect structure 230 should not be limited by the embodiments or drawings of this disclosure. For example, the interconnect structure 230 at least includes insulating layers 231, 233, conductive vias 232 and conductive traces 234. In one embodiment, the conductive vias 232 are disposed on and electrically connected to the semiconductor devices 10A through the conductive terminals 160 exposed by the dielectric layer 170. The conductive traces 234 are disposed on and electrically connected to the conductive vias 232. The insulating layers 231, 233 are collectively referred to as an IMD layer laterally wrapping the conductive vias 232 and the conductive traces 234 to constitute a build-up layer (not labelled). In some embodiments, a voltage may be provided to the gate of the semiconductor devices 10A through the interconnect structure 220 (e.g. the conductive traces 228) for turning "on" or "off" the channels, while other voltages may be provided to the source and the drain of the semiconductor devices 10A through the interconnect structure 230 (e.g. the conductive vias 232) for controlling the flow (e.g. flowing direction) of charges inside the semiconductor devices 10A.

In some embodiments, a material of the insulating layers 221, 223, 225, 227, 231 and 233 independently includes a dielectric material, such as silicon oxide, silicon nitride, silicon carbide, silicon oxynitride, silicon carbonitride, silicon carbide oxynitride, SOG, PSG, BPSG, FSG, carbon doped silicon oxide (e.g., SiCOH), polyimide, a low-k dielectric material and/or a combination thereof. In certain embodiments, the material of the insulating layers 221, 223, 225, 227, 231 and 233 independently includes a semiconductor material such as Si or Ge, a metal oxide material such as $Al_2O_3$, ITO, or the like. The formation of the insulating layers 221, 223, 225, 227, 231 and 233 independently includes performing one or more processes by deposition, spin-coating, sputtering, or other suitable methods. In one embodiment, the underlying structure 100 is a part of the interconnect structure 220 (e.g. the topmost build-up tier), where the insulating layer 227 of FIG. 19 is substantially similar to the isolation structure 102 of FIG. 2, and the conductive traces 228 of FIG. 19 are substantially similar to the connection structure 104 of FIG. 2. With such embodiment, the material of the insulating layer 227 is different from the material of the insulating layers 221, 223 and/or 225, so as to serve as an etching stop layer/structure to prevent any undesired damages or etches to layers underneath thereto.

In some embodiments, the materials of the conductive vias 222, 226 and 232 and the conductive traces 224, 228 and 234 independently include Al, aluminum alloys, Cu, copper alloys, W, or combinations thereof. The conductive traces 224, 228 and 234 may be referred to as conductive lines or wires. In some embodiments, the conductive vias 222, 226 and 232 and the respective one of the conductive traces 224, 228 and 234 are formed by a dual damascene process. That is, the conductive vias 222 and the conductive traces 224 may be formed simultaneously, the conductive vias 226 and the conductive traces 228 may be formed simultaneously, and the conductive vias 323 and the conductive traces 324 may be formed simultaneously, for example.

Figure 9:
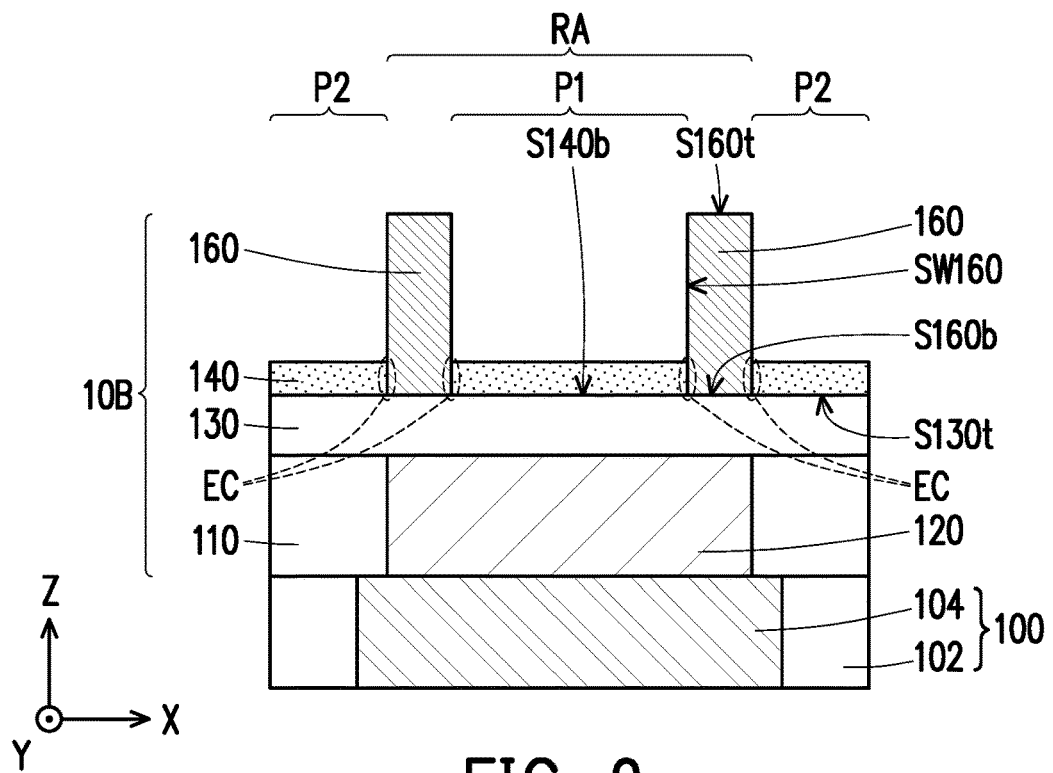
FIG. 9 is a schematic cross-sectional view showing a semiconductor device in accordance with some alternative embodiments of the disclosure.
Figure 10:
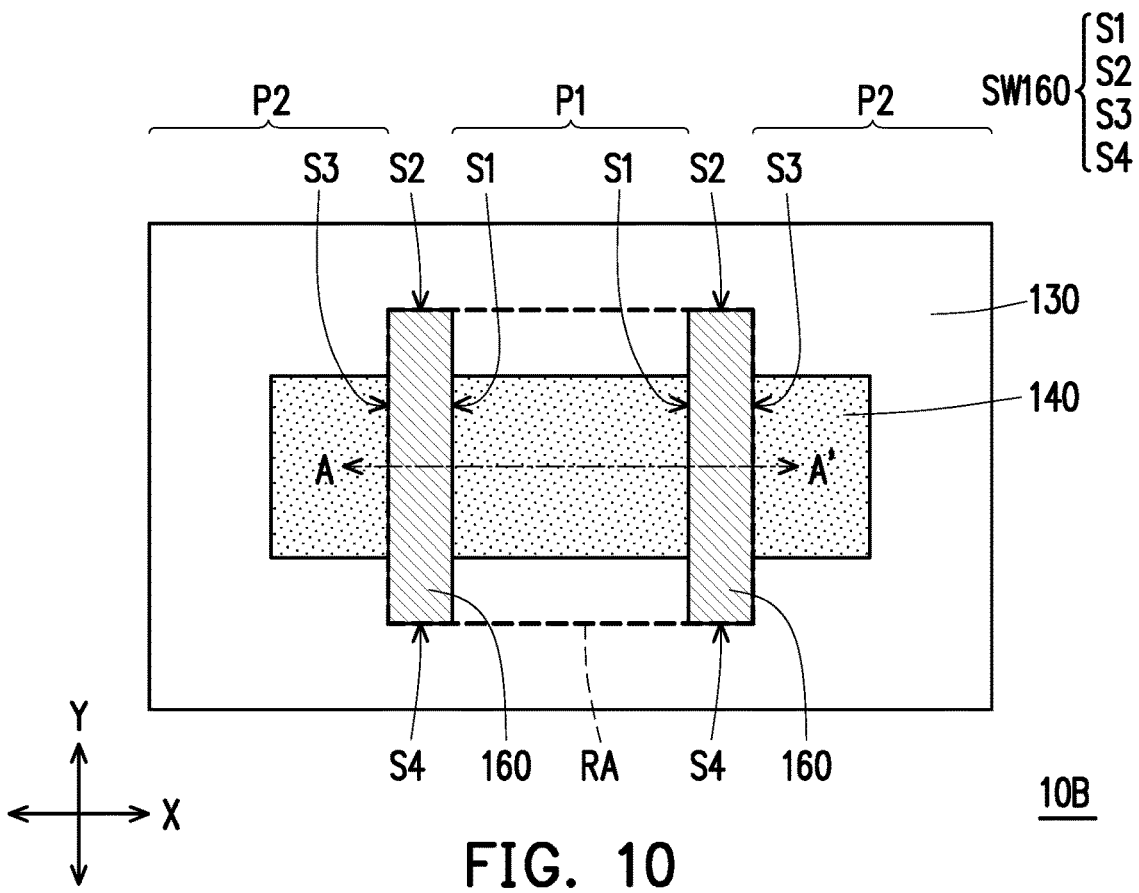
FIG. 10 is a schematic plane view of the semiconductor device depicted in FIG. 9.
Figure 13:
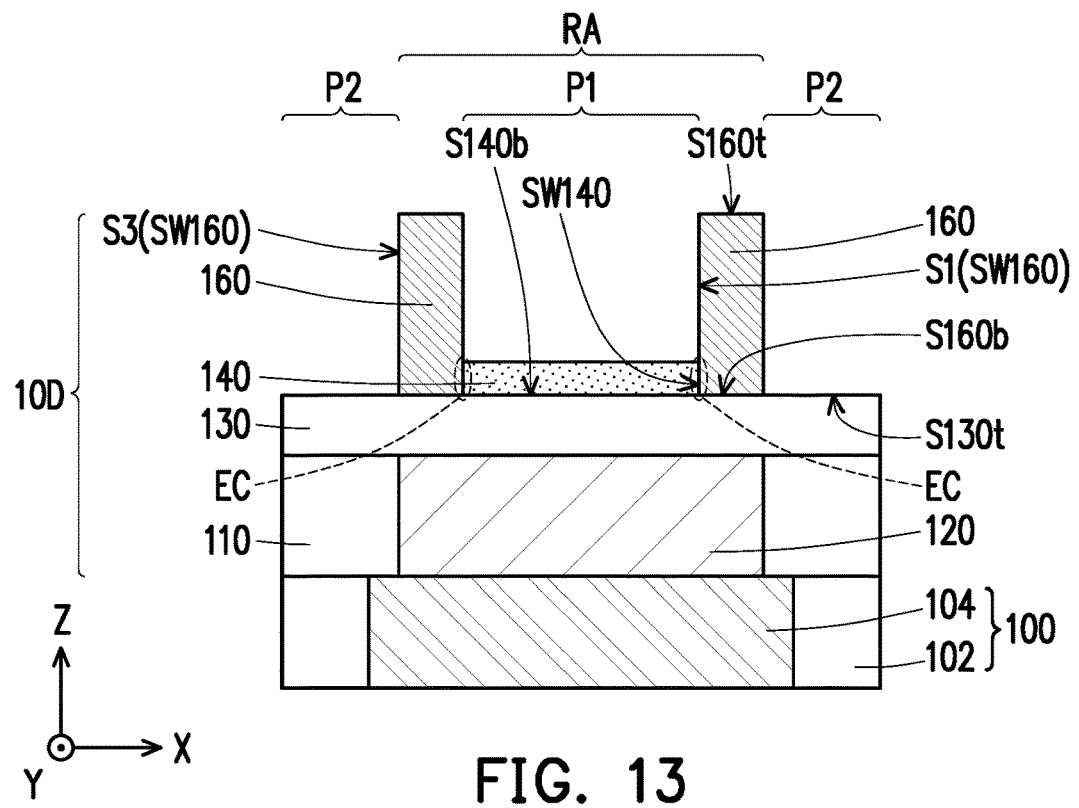
FIG. 13 is a schematic cross-sectional view showing a semiconductor device in accordance with some alternative embodiments of the disclosure.
Figure 14:
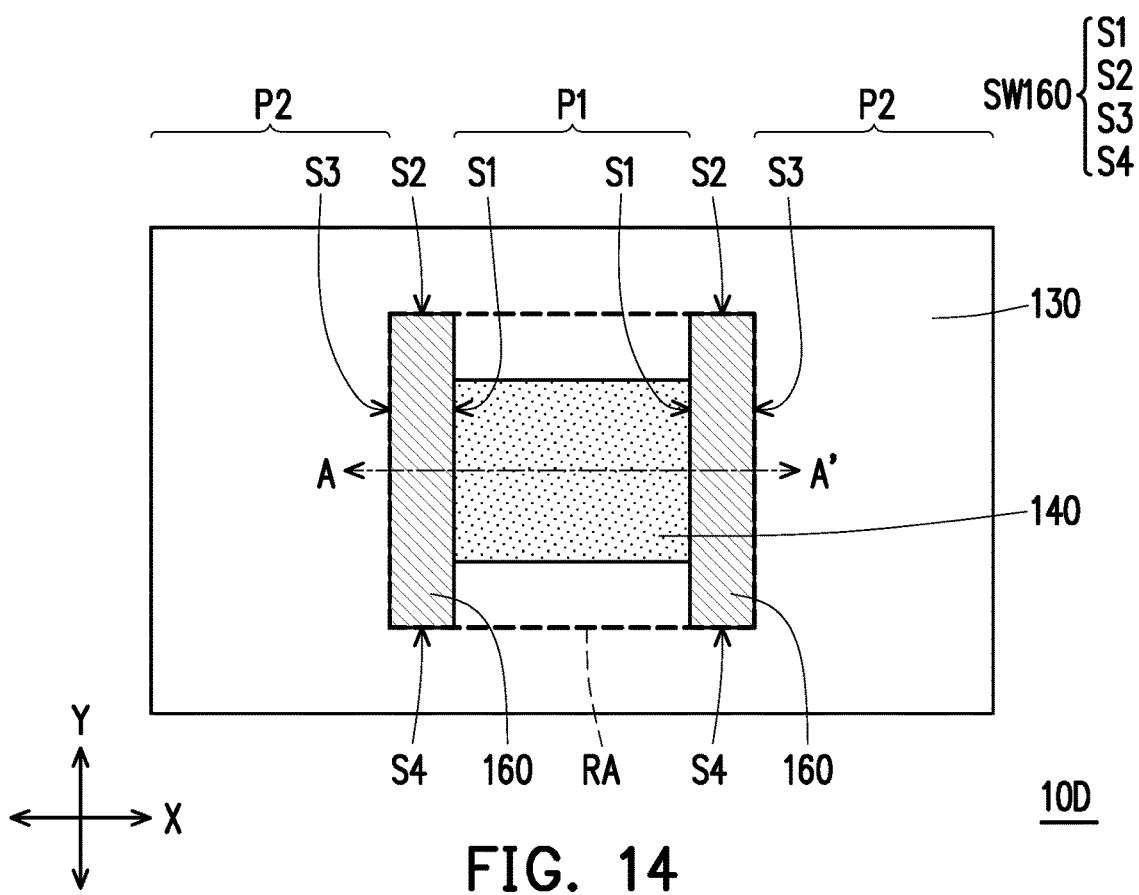
FIG. 14 is a schematic plane view of the semiconductor device depicted in FIG. 13.

In some embodiments, the semiconductor devices 10A may be disposed between any two adjacent conductive layers in the back-end-of-line (BEOL) structure. In certain embodiments, the fabricating process of the semiconductor devices 10A may be compatible with the BEOL process of the semiconductor device, thereby simplifying process steps and efficiently improving the integration density. It is noted that although the semiconductor devices 10A are adopted in the IC 2000 as shown in FIG. 19, the embodiments of the disclosure are not limited thereto. In other embodiments, another semiconductor device (e.g. 10B of FIGS. 9-10, 10C of FIGS. 11-12, 10D of FIGS. 13-14, 20A of FIG. 15, 20B of FIG. 16, 20C of FIG. 17, 20D of FIG. 18 and/or their modifications) may be used to replace as least one of the semiconductor devices 10A in FIG. 19.

FIGS. 9-10, FIGS. 11-12, FIGS. 13-14, FIG. 15, FIG. 16, FIG. 17 and FIG. 18 show various embodiments of a semiconductor device in accordance with some alternative embodiments of the disclosure.

In alternative embodiments (not shown), the semiconductor device 10A is modified to have the dielectric layer 150 being located between the semiconductor layer 140 and the dielectric layer 130, where the conductive terminals 160 penetrates through the semiconductor layer 140 and the dielectric layer 150 to directly stand on the dielectric layer 130. In further alternative embodiments, the dielectric layer 150 of the semiconductor device 10A may be omitted, see a semiconductor device 10B of FIGS. 9-10. The semiconductor device 10B may be formed by, but not limited to, steps S10, S20, S30, S60 and S70 of the method 1000 in FIG. 1.

Figure 11:
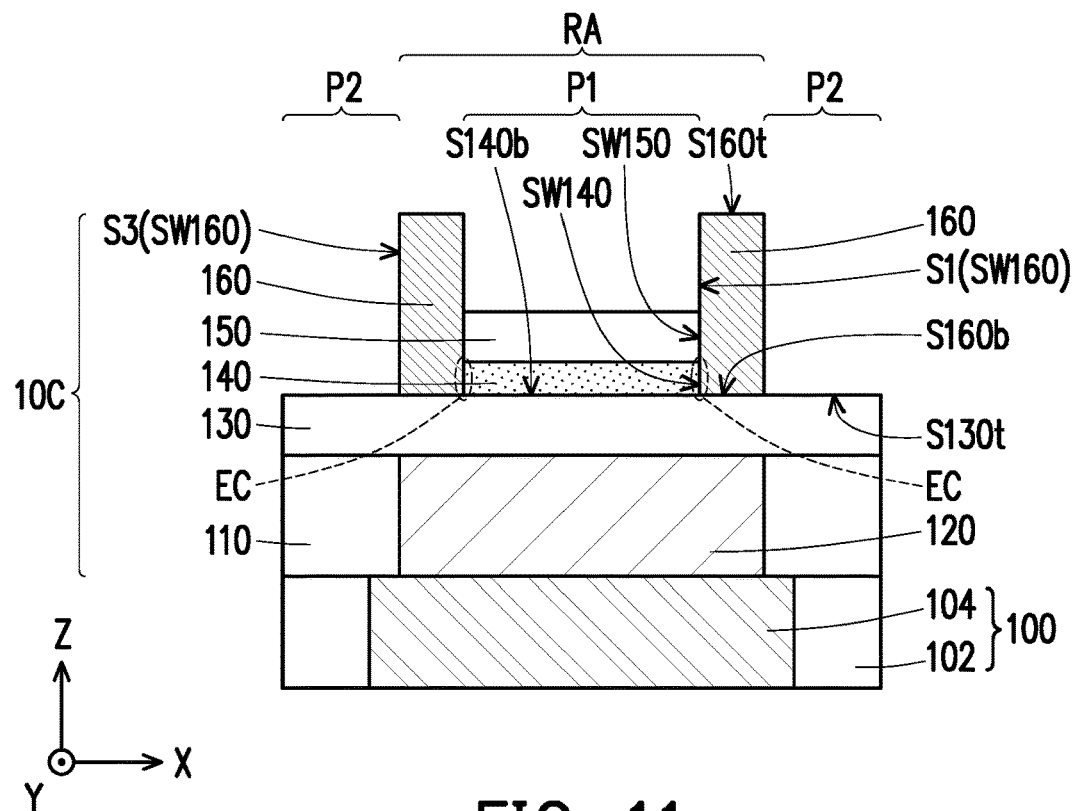
FIG. 11 is a schematic cross-sectional view showing a semiconductor device in accordance with some embodiments of the disclosure.
Figure 12:
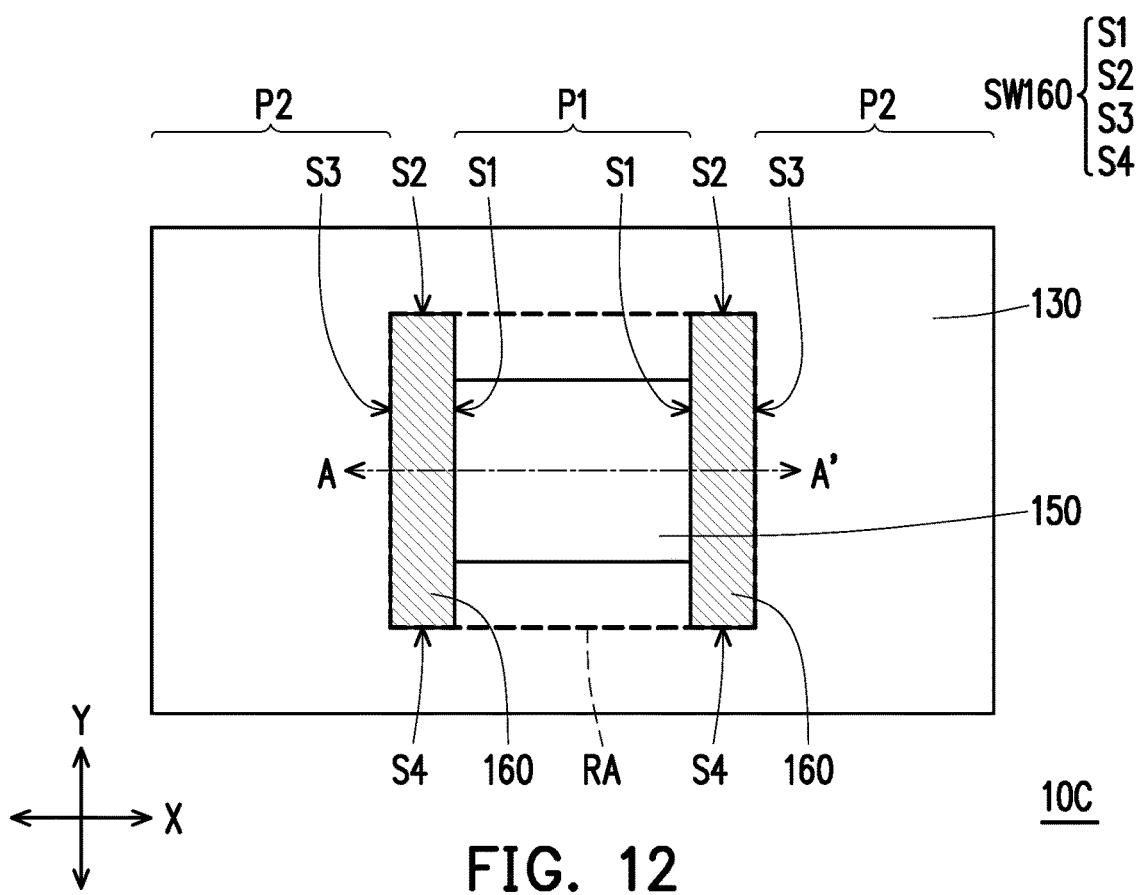
FIG. 12 is a schematic plane view of the semiconductor device depicted in FIG. 11.

In some embodiments, for the semiconductor device 10A of FIGS. 7-8, a portion of the dielectric layer 150 and a portion of the semiconductor layer 140 are disposed in a region P1, and the rest of the dielectric layer 150 and the semiconductor layer 140 are disposed in regions P2. For example, as shown FIGS. 7-8, the region P1 is located between a pair of the regions P2, each of the regions P2 is separated from the region P1 by one of the conductive terminals 160, and the region P1 is sandwiched between the conductive terminals 160. In some embodiments, the sides S2 and S4 of the sidewalls SW160 are free of the semiconductor layer 140 and the dielectric layer 150, in the semiconductor device 10A. However, the disclosure is not limited thereto; the dielectric layer 150 and the semiconductor layer 140 disposed in the regions P2 may be omitted. A semiconductor device 10C depicted in FIGS. 11-12 is similar to the semiconductor device 10A depicted in FIGS. 7-8, the difference is that, there is no dielectric layer 150 and semiconductor layer 140 disposed in the regions P2 of the semiconductor device 10C. In some embodiments, as shown in FIG. 12, in the top view, a positioning location of the semiconductor layer 140 and the dielectric layer 150 are located within the region RA. For example, a sidewall SW140 of the semiconductor layer 140 and a sidewall SW150 of the dielectric layer 150 are substantially aligned to each other in the direction Z. As shown in FIG. 11, the semiconductor layer 140 and the dielectric layer 150 are only in contact with the sidewalls SW160 (e.g., the sides S1) of the conductive terminals 160, in some embodiments. For example, the sides S2, S3 and S4 of the sidewalls SW160 are free of the semiconductor layer 140 and the dielectric layer 150, in the semiconductor device 10C. The semiconductor device 10C may be formed by, but not limited to, steps S10 through S70 of the method 1000 in FIG. 1.

In alternative embodiments (not shown), the semiconductor device 10C is modified to have the dielectric layer 150 being located between the semiconductor layer 140 and the dielectric layer 130, where the conductive terminals 160 penetrates through the semiconductor layer 140 and the dielectric layer 150 to directly stand on the dielectric layer 130. However, the disclosure is not limited thereto. In further alternative embodiments, the semiconductor layer 140 disposed in the regions P2 may be omitted and the dielectric layer 150 may be omitted, see a semiconductor device 10D of FIGS. 13-14. The semiconductor device 10D may be formed by, but not limited to, steps S10, S20, S30, S60 and S70 of the method 1000 in FIG. 1.

Figure 15:
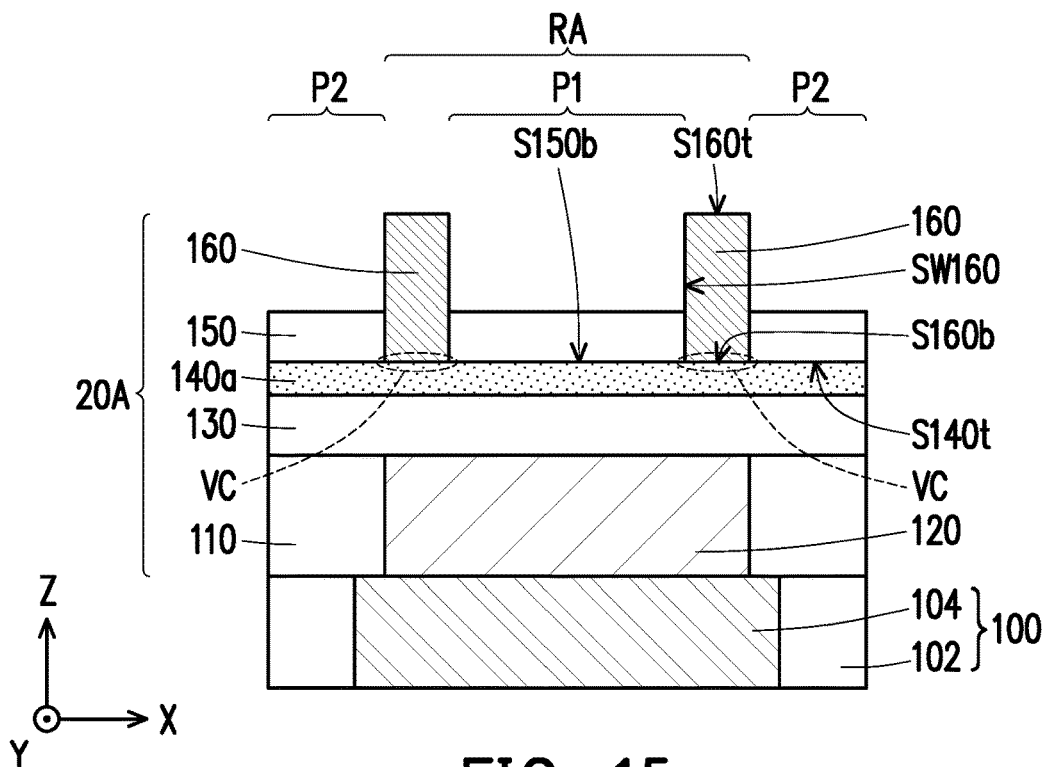
FIG. 15 is a schematic cross-sectional view showing a semiconductor device in accordance with some alternative embodiments of the disclosure.

In the embodiments of the semiconductor devices 10A through 10D, there is the edge contact EC between the semiconductor layer 140 and each of the conductive terminals 160. However, the disclosure is not limited thereto. In alternative embodiments, the edge contact EC is substituted with a vertical contact (e.g. VC). A semiconductor device 20A depicted in FIG. 15 is similar to the semiconductor device 10A depicted in FIGS. 7-8, the difference is that, the semiconductor layer 140a is adopted instead of the semiconductor layer 140, where the conductive terminals 160 stand on the semiconductor layer 140a. The semiconductor device 20A may be formed by, but not limited to, steps S10, S20, S30, S40, S50 and S70 of the method 1000 in FIG. 1. The same reference numerals are used to refer to the same or liked parts, and its detailed description (e.g. forming method, material, configuration, electrical connection or the like) will be omitted herein for simplicity.

For example, in the semiconductor device 20A of FIG. 15, the semiconductor layer 140a is not patterned, and the conductive terminals 160 penetrate through the dielectric layer 150 and stand on the top surface S140t of the semiconductor layer 140a. In certain embodiments, the conductive terminals 160 are in physical (or direct) contact with the semiconductor layer 140a. As shown in FIG. 15, for example, the bottom surfaces S160b of the conductive terminals 160 are in physical contact with the top surface S140t of the semiconductor layer 140a. In some embodiments, a vertical contact VC is presented at an interface between the conductive terminals 160 and the semiconductor layer 140a. That is, a proper contact between the conductive terminals 160 and the semiconductor layer 140a is established. The vertical contact may be referred to as a top contact. As illustrated in FIG. 15, a bottom surface S150b of the dielectric layer 150 and the bottom surfaces S160b of the conductive terminals 160 are substantially coplanar to each other at the top surface S140t of the semiconductor layer 140a, for example. In some embodiments, the sidewalls SW160 of the conductive terminals 160 are completely free from the semiconductor layer 140a.

Figure 16:
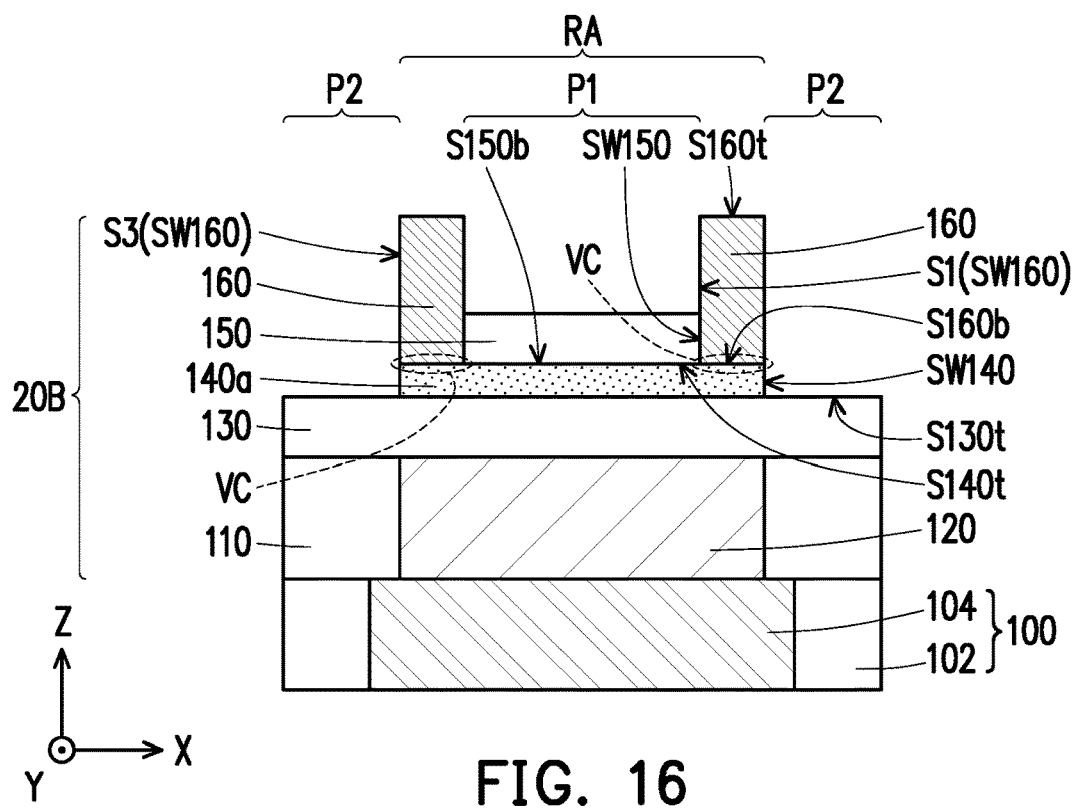
FIG. 16 is a schematic cross-sectional view showing a semiconductor device in accordance with some alternative embodiments of the disclosure.
Figure 17:
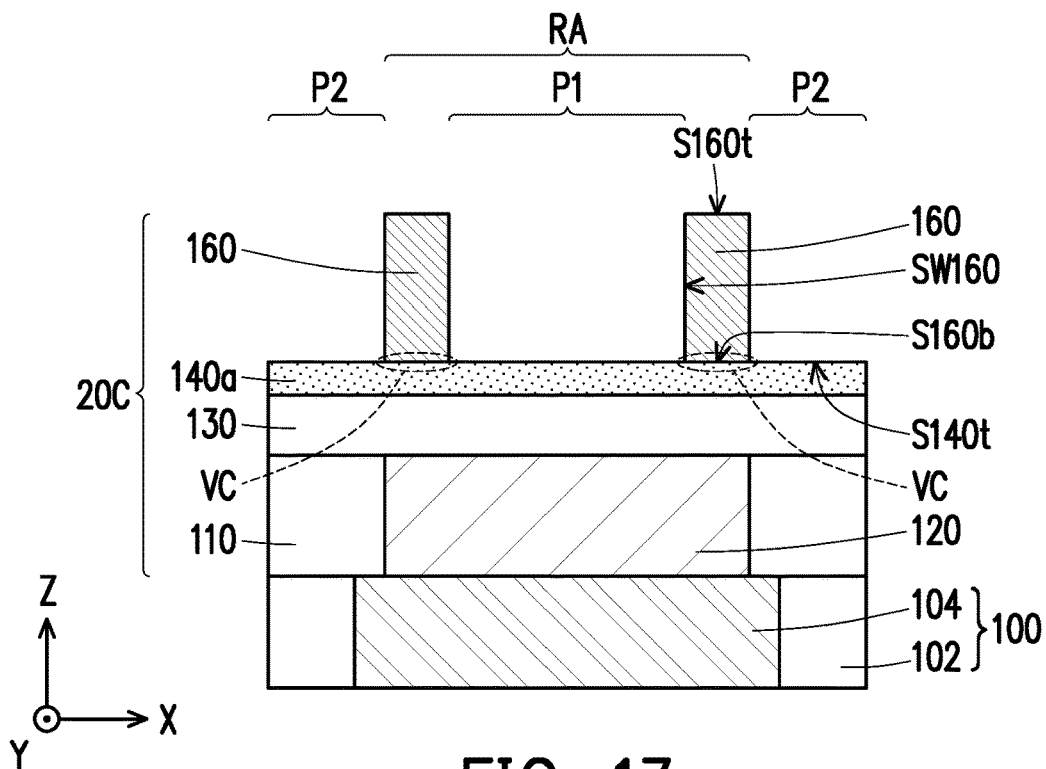
FIG. 17 is a schematic cross-sectional view showing a semiconductor device in accordance with some alternative embodiments of the disclosure.
Figure 18:
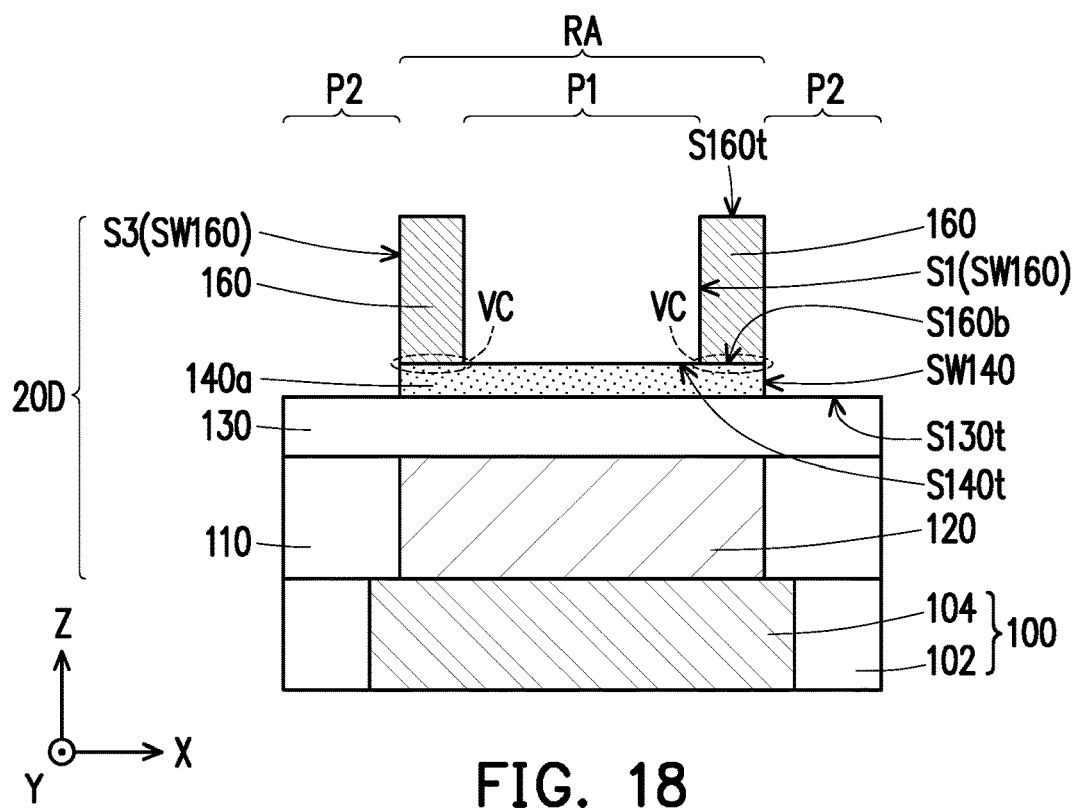
FIG. 18 is a schematic cross-sectional view showing a semiconductor device in accordance with some alternative embodiments of the disclosure.

A semiconductor device 20B depicted in FIG. 16, a semiconductor device 20C depicted in FIG. 17 and a semiconductor device 20D depicted in FIG. 18 are independently similar to the semiconductor device 20A depicted in FIG. 15, and thus the same reference numerals are used to refer to the same or liked parts, and its detailed description (e.g. forming method, material, configuration, electrical connection or the like) will be omitted herein for simplicity. In some embodiments, there is no dielectric layer 150 and semiconductor layer 140a disposed in the regions P2, see the semiconductor device 20B of FIG. 16. As shown in the semiconductor device 20B of FIG. 16, the sidewall SW140 of the semiconductor layer 140 is substantially aligned with the sidewalls SW160 (e.g. the sides S3) of the conductive terminals 160, for example. The semiconductor device 20B may be formed by, but not limited to, steps S10, S20, S30, S40, S50 and S70 of the method 1000 in FIG. 1. In alternative embodiments, the dielectric layer 150 may be omitted, see the semiconductor device 20C depicted in FIG. 17. The semiconductor device 20A may be formed by, but not limited to, steps S10, S20, S30 and S70 of the method 1000 in FIG. 1. In further alternative embodiments, the semiconductor layer 140a disposed in the regions P2 may be omitted and the dielectric layer 150 may be omitted, see the semiconductor device 20D of FIG. 18. The semiconductor device 20D may be formed by, but not limited to, steps S10, S20, S30 and S70 of the method 1000 in FIG. 1. As shown in the semiconductor device 20D of FIG. 18, the sidewall SW140 of the semiconductor layer 140 is substantially aligned with the sidewalls SW160 (e.g. the sides S3) of the conductive terminals 160, for example. However, the disclosure is not limited thereto. In one embodiment (not shown), the semiconductor device 20A or 20C is modified to have the dielectric layer 150 being located between the semiconductor layer 140a and the dielectric layer 130, where the conductive terminals 160 directly stand on the semiconductor layer 140a.

In accordance with some embodiments, a semiconductor device includes a gate layer, a channel material layer, a first dielectric layer and source/drain terminals. The gate layer is disposed over a substrate. The channel material layer is disposed over the gate layer, where a material of the channel material layer includes a first low dimensional material. The first dielectric layer is sandwiched between the gate layer and the channel material layer. The source/drain terminals are in contact with the channel material layer, where the channel material layer is at least partially sandwiched between the source/drain terminals and over the gate layer, and the gate layer is disposed between the substrate and the source/drain terminals.

In accordance with some embodiments, an integrated circuit includes a semiconductor substrate, a first interconnect structure, a first semiconductor device and a second interconnect structure. The first interconnect structure is disposed over the semiconductor substrate. The first semiconductor device is disposed over the first interconnect structure, where the first semiconductor device includes a conductive layer disposed over and electrically coupled to the first interconnect structure, a dielectric layer disposed on the conductive layer, a semiconductor layer disposed over the dielectric layer, wherein a material of the semiconductor layer comprises a low dimensional material, and conductive terminals contacting the semiconductor layer. The semiconductor layer is sandwiched between the conductive terminals and over the conductive layer, and the conductive layer is disposed between the first interconnect structure and the conductive terminals. The second interconnect structure is disposed over the first semiconductor device and electrically coupled to the conductive terminals, where the first semiconductor device is disposed between the first interconnect structure and the second interconnect structure, and the first interconnect structure is disposed between the first semiconductor device and the semiconductor substrate.

In accordance with some embodiments, a method of manufacturing a semiconductor device includes the following steps: forming a gate layer over a substrate; depositing a first dielectric layer over the gate layer; forming a channel material layer over the first dielectric layer with a first low dimensional material, the first dielectric layer being sandwiched between the channel material layer and the gate layer; and forming source/drain terminals over the channel material layer, the channel material layer being at least partially sandwiched between the source/drain terminals and over the gate layer, and the gate layer being sandwiched between the substrate and the source/drain terminals.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a gate layer, disposed over and electrically coupled to a substrate;
   a channel material layer, disposed over the gate layer, wherein a material of the channel material layer comprises a first low dimensional material;
   a first dielectric layer, sandwiched between the gate layer and the channel material layer, wherein sidewalls of the gate layer is free of the first dielectric layer; and
   source/drain terminals, in contact with the channel material layer, wherein the channel material layer is at least partially sandwiched between the source/drain terminals and over the gate layer, and the gate layer is disposed between the substrate and the source/drain terminals.

2. The semiconductor device of claim 1, wherein the source/drain terminals penetrate through the channel material layer and stand on the first dielectric layer, and sidewalls of the source/drain terminals are in contact with the channel material layer,
   wherein along a stacking direction of the gate layer and the substrate, the channel material layer is next to the source/drain terminals and overlapped with the gate layer.

3. The semiconductor device of claim 2, further comprising:
   a second dielectric layer, wherein the channel material layer is sandwiched between the second dielectric layer and the first dielectric layer, and the source/drain terminals penetrate through the second dielectric layer and the channel material layer to stand on the first dielectric layer, or
   a second dielectric layer, wherein the second dielectric layer is sandwiched between the channel material layer and the first dielectric layer, and the source/drain terminals penetrate through the channel material layer and the second dielectric layer to stand on the first dielectric layer.

4. The semiconductor device of claim 3, wherein a material of the second dielectric layer comprises a second low dimensional material different from the first low dimensional material, and wherein:
   the first low dimensional material comprises a carbon nanotube, a nanoribbon, a semiconducting two-dimensional material of transition metal dichalcogenides, and combinations thereof.

5. The semiconductor device of claim 1, wherein the source/drain terminals stand on and in contact with a first surface of the channel material layer, wherein a second surface of the channel material layer is opposite to the first surface and facing away from the source/drain terminals, and sidewalls of the source/drain terminals are free from the channel material layer,
   wherein along a stacking direction of the gate layer and the substrate, the channel material layer is overlapped with the source/drain terminals and the gate layer.

6. The semiconductor device of claim 5, further comprising:
a second dielectric layer, wherein the channel material layer is sandwiched between the second dielectric layer and the first dielectric layer, and the source/drain terminals penetrate through the second dielectric layer to stand on the channel material layer, or
a second dielectric layer, wherein the second dielectric layer is sandwiched between the channel material layer and the first dielectric layer, and the source/drain terminals stand on the channel material layer over the second dielectric layer.

7. The semiconductor device of claim 6, wherein a material of the second dielectric layer comprises a second low dimensional material different from the first low dimensional material, and wherein:
the first low dimensional material comprises a carbon nanotube, a nanoribbon or a semiconducting two-dimensional material of transition metal dichalcogenides, and combinations thereof.

8. A method of manufacturing a semiconductor device, comprising:
forming a gate layer over a substrate, the gate layer being electrically coupled to the substrate;
depositing a first dielectric layer over the gate layer, wherein sidewalls of the gate layer is free of the first dielectric layer;
forming a channel material layer over the first dielectric layer with a first low dimensional material, the first dielectric layer being sandwiched between the channel material layer and the gate layer; and
forming source/drain terminals over the substrate and in contact with the channel material layer, the channel material layer being at least partially sandwiched between the source/drain terminals and over the gate layer, and the gate layer being sandwiched between the substrate and the source/drain terminals.

9. The method of claim 8, after forming the channel material layer and prior to forming the source/drain terminals, further comprising:
performing a patterning process to form openings penetrating through the channel material layer,
wherein the forming the source/drain terminals over the channel material layer comprises forming the source/drain terminals on the channel material layer and further extending into the openings to form an edge contact at interfaces between the channel material layer and sidewalls of the source/drain terminals.

10. The method of claim 8, after forming the channel material layer and prior to forming the source/drain terminals, further comprising:
forming a heat dissipating layer over the channel material layer with a second low dimensional material, the second low dimensional material being different from the first low dimensional material; and
performing a patterning process to form openings penetrating through the heat dissipating layer,
wherein the forming the source/drain terminals over the channel material layer comprises forming the source/drain terminals on the heat dissipating layer and further extending into the openings to form a vertical contact at interfaces between the channel material layer and bottom surfaces of the source/drain terminals.

11. The method of claim 8, after forming the channel material layer and prior to forming the source/drain terminals, further comprising:
forming a heat dissipating layer over the channel material layer with a second low dimensional material, the second low dimensional material being different from the first low dimensional material; and
performing a patterning process to form openings penetrating through the heat dissipating layer and the channel material layer,
wherein the forming the source/drain terminals over the channel material layer comprises forming the source/drain terminals on the heat dissipating layer and further extending into the openings to form an edge contact at interfaces between the channel material layer and sidewalls of the source/drain terminals.

12. A method of manufacturing an integrated circuit, comprising:
providing a semiconductor substrate comprising a plurality of first semiconductor devices;
forming a first interconnect structure over the semiconductor substrate, the plurality of first semiconductor devices being electrically coupled to the first interconnect structure;
forming at least one second semiconductor device by a method as claimed in claim 8 over the first interconnect structure for electrically coupling and electrically communicating the at least one second semiconductor device and at least one of the plurality of first semiconductor devices through the first interconnect structure, the substrate being comprised in the first interconnect structure; and
forming a second interconnect structure over the at least one second semiconductor device to electrically couple the second interconnect structure and the source/drain terminals of the at least one second semiconductor device.

13. A semiconductor device, comprising:
a gate layer, disposed over a substrate;
a channel material layer, disposed over the gate layer, wherein a material of the channel material layer comprises a first low dimensional material;
a first dielectric layer, sandwiched between the gate layer and the channel material layer;
source/drain terminals, in contact with the channel material layer, wherein the channel material layer is at least partially sandwiched between the source/drain terminals and over the gate layer, and the gate layer is disposed between the substrate and the source/drain terminals; and
a second dielectric layer, disposed over the gate layer, wherein the source/drain terminals penetrate through the second dielectric layer, and an outermost surface of the second dielectric layer is lower than outermost surfaces of the source/drain terminals.

14. The semiconductor device of claim 13, wherein the source/drain terminals further penetrate through the channel material layer and stand on the first dielectric layer, and sidewalls of the source/drain terminals are in contact with the channel material layer,
wherein along a stacking direction of the gate layer and the substrate, the channel material layer is next to the source/drain terminals and overlapped with the gate layer.

15. The semiconductor device of claim 13, wherein the channel material layer is sandwiched between the second dielectric layer and the first dielectric layer, and the source/drain terminals penetrate through the second dielectric layer and the channel material layer to stand on the first dielectric layer.

16. The semiconductor device of claim 13, wherein the second dielectric layer is sandwiched between the channel material layer and the first dielectric layer, and the source/drain terminals penetrate through the channel material layer and the second dielectric layer to stand on the first dielectric layer.

17. The semiconductor device of claim 13, wherein a material of the second dielectric layer comprises a second low dimensional material different from the first low dimensional material, and wherein:

the first low dimensional material comprises a carbon nanotube, a nanoribbon, a semiconducting two-dimensional material of transition metal dichalcogenides, and combinations thereof.

18. The semiconductor device of claim 13, wherein the source/drain terminals stand on and in contact with a first surface of the channel material layer, wherein a second surface of the channel material layer is opposite to the first surface and facing away from the source/drain terminals, and sidewalls of the source/drain terminals are free from the channel material layer, wherein along a stacking direction of the gate layer and the substrate, the channel material layer is overlapped with the source/drain terminals and the gate layer.

19. The semiconductor device of claim 18, wherein:

the channel material layer is sandwiched between the second dielectric layer and the first dielectric layer, and the source/drain terminals penetrate through the second dielectric layer to stand on the channel material layer.

20. The semiconductor device of claim 13, wherein a material of the second dielectric layer comprises a second low dimensional material different from the first low dimensional material, and wherein:

the first low dimensional material comprises a carbon nanotube, a nanoribbon or a semiconducting two-dimensional material of transition metal dichalcogenides, and combinations thereof.

* * * * *